(12) United States Patent
Hirosawa et al.

(10) Patent No.: US 6,584,014 B2
(45) Date of Patent: Jun. 24, 2003

(54) NONVOLATILE STORAGE SYSTEM

(75) Inventors: Seisuke Hirosawa, Kodaira (JP); Masaki Shirai, Sayama (JP); Takeshi Suzuki, Inagi (JP); Katsumi Ouchi, Higashimurayama (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/082,084

(22) Filed: Feb. 26, 2002

(65) Prior Publication Data

US 2002/0181285 A1 Dec. 5, 2002

(30) Foreign Application Priority Data

May 31, 2001 (JP) .......................... 2001-164188

(51) Int. Cl.[7] .......................... G11C 16/06; G11C 16/04
(52) U.S. Cl. .............................. 365/185.09; 365/185.11; 365/185.29
(58) Field of Search ................. 365/185.09, 185.11, 365/185.29, 185.33; 714/5, 6

(56) References Cited

U.S. PATENT DOCUMENTS 5,123,016 A * 6/1992 Muller et al. ............... 365/200
5,630,044 A * 5/1997 Suzuki ............................ 714/5
6,388,920 B2 * 5/2002 Katayama et al. .......... 365/200

* cited by examiner

Primary Examiner—Trong Phan
(74) Attorney, Agent, or Firm—Miles & Stockbridge P.C.

(57) ABSTRACT

A nonvolatile storage system includes a plurality of nonvolatile memories and a control unit. When having detected a write-in error that occurred at an operation-subject nonvolatile memory, the control unit can set inter-chip alternate information indicating that a storage region related to the write-in error has been replaced by a storage region of any other nonvolatile memory of the plurality of nonvolatile memories to the nonvolatile memory of the storage region related to this error, so that when having received the inter-chip alternate information from the operation-subject nonvolatile memory, the control unit can change the operation subject from the current operation-subject nonvolatile memory to any other nonvolatile memory indicated by this inter-chip alternate information. It is thus possible to rescue a write-in error which occurred at one nonvolatile memory by replacing it with any other chip.

18 Claims, 20 Drawing Sheets

(FLOW FOR CALCULATING ALTERNATE DESTINATION)

NONVOLATILE STORAGE SYSTEM

BACKGROUND OF THE INVENTION

The present invention relates to a technology for rescuing such a storage region in any one of a plurality of nonvolatile memories that encounters a fault occurring time-wise in a nonvolatile storage system that has these memories, for example, to such a technology that is effectively applicable to such a memory card as an Advanced Technology attachment (ATA) memory card mounted with a flash memory.

An electrically rewritable nonvolatile memory such as a flash memory stores information based on a threshold voltage, which varies with an amount of electrons or positive holes injected into the floating gate of the memory cells. The properties of such a threshold voltage of the memory cells will deteriorate time-wise as the number of times of rewriting the memory contents increases. Such a deterioration in the properties results in a write-in error being detected in verification. To solve this problem, there has conventionally been provided a rescue technology for replacing a storage region in which a write-in error occurred with another storage region.

For example, in an ATA memory card used as a file memory, the storage regions of each of nonvolatile memories are divided into such functional sections as a data block regions section, a data-block alternate regions section for rescue, etc. so that each of these functional sections is defined as an aggregate of data blocks given in units of one sector and a corresponding management region. Each of the data blocks is assigned an inherent physical address in each of the memories. If a write-in error occurs in any of these data block regions, a flag indicating the error is set to this region, to set the physical address of such a data block region in said data block alternate regions section that is to substitute for said faulty data block region. Write-in data related to the write-in error is written into a data block of that alternate address. Then, if access is made to the address of said faulty data block, this data block is recognized to be faulty based on the error flag set in its corresponding management region so that access may be made instead to such a data block in the data block alternate regions section that is specified by the alternate address.

SUMMARY OF THE INVENTION

The Inventor, however, recognized a problem that in a case where a faulty data block is to be replaced with another only within the corresponding one of a plurality of nonvolatile memories and there is a deviation in fault occurrence ratio among them, if so many write-in errors occur in any one of these memories that cannot be accommodated by the rescue capacity of the data block alternate data block regions section in this memory, the entire relevant memory card must be treated as being faulty.

Concerning this, there have been disclosed such a conventional technology of having a preliminary nonvolatile memory for a backup purpose that is disclosed in JP-A-3-25798 and such a method for processing data necessary to replace a faulty nonvolatile memory that is disclosed in JP-A-9-200636.

The conventional technologies, however, are based on a premise that a faulty nonvolatile memory is to be replaced or a redundant (spare) nonvolatile memory and so are yet to fully utilize the storage regions of each of nonvolatile memories without replacing a faulty one of them.

In view of the above, it is an object of the present invention to provide a nonvolatile storage system that can improve redressing efficiency for a write-in error occurring as time passes by without replacing a faulty one of nonvolatile memories or using a spare nonvolatile memory in the system.

It is another object of the present invention to provide a nonvolatile storage system that can avoid an overall failure thereof without replacing a faulty one of nonvolatile memories or using a spare nonvolatile memory in the system even if a faulty data block cannot be replaced within any one of these memories.

It is a further object of the present invention to provide a nonvolatile storage system that can utilize the storage regions of each nonvolatile memory without waste when replacing a faulty data block.

The typical contents of the present invention in this application are outlined as follows.

(1) Inter-chip alternate: A nonvolatile storage system according to the present invention comprises a plurality of nonvolatile memories capable of read-out, erasure, and write-in operations and a control unit for controlling the operations of these nonvolatile memories in response to an external request. When having detected a write-in error on an operation-subject one of said plurality of nonvolatile memories, said control unit can set inter-chip alternate information about a fact that a storage region related to the write-in error has been replaced by a storage region in another one of said plurality of nonvolatile memories to the nonvolatile memory related to this error and also, when having received inter-chip alternate information from the current operation-subject nonvolatile memory, can switch the operation-subject memory from it to such another nonvolatile memory that is indicated by the chip alternate information. In the present specification, a write-in error refers to a state where when a write-in voltage is applied to a nonvolatile memory (programming) to then verify it, a predetermined threshold voltage cannot be obtained or a state where when the write-in subject is replaced already, confirmation of whether a alternate destination address can be obtained before start of said programming and programming verification finds that it is impossible.

It is thus possible, in inter-chip alternate, to redress a write-in error which occurred at one nonvolatile memory by using a storage region of another nonvolatile memory. This makes it possible, if a faulty data block cannot be replaced with another within one of a plurality of nonvolatile memories, to avoid an overall system error without replacing the faulty nonvolatile memory or using a preliminary nonvolatile memory.

If a write-in error occurred in a nonvolatile memory in which the number of the remaining storage regions capable of new placement has decreased to a predetermined number or less, preferably inter-chip alternate is allowed to that memory. It is thus possible to enable inter-chip alternate so as to eliminate waste of the data blocks as much as possible. That is, by starting inter-chip alternate before such a nonvolatile memory appears that is exhausted to such an extent that intra-chip alternate is no longer possible, the remaining regions capable of new alternate hardly have a large deviation among themselves, thus making it possible to minimize the number of processing cycles required for inter-chip alternate and intra-chip alternate. This is because, if there is a large deviation in the number of the regions capable of new alternate among nonvolatile memories, the number of such nonvolatile memories of these that can be adopted as a alternate destination is decreased, to increase the number of times of making retrieval retrials for looking for such a nonvolatile memory that can be adopted as an inter-chip alternate destination.

To enable inter-chip alternate so as to eliminate waste in the data blocks, inter-chip alternate can be allowed for a write-in error which occurred in a nonvolatile memory in which the number of the storage regions that can be adopted as a alternate destination has been decreased to a predetermined number of less.

A write-in error that occurred in such a nonvolatile memory that is capable of alternate can be accommodated by intra-chip alternate. For example, if a write-in error occurred in a nonvolatile memory which has the storage regions capable of alternate as many as a predetermined number or more, said control unit sets intra-chip alternate information indicating that a storage region related to the write-in error has been replaced with another storage region to such a nonvolatile memory that has the storage region related to this error and also makes it possible to obtain the intra-chip alternate information from an operation-subject nonvolatile memory to then change the operation subject from it to such a storage region that is indicated by this intra-chip alternate information.

It is thus possible to improve the rescue efficiency for write-in errors occurring time-wise without replacing a faulty nonvolatile memory or using a preliminary nonvolatile memory, thus utilizing the storage regions of each of the nonvolatile memories without waste in alternate of faulty data blocks.

Note here that of course a storage region used for said inter-chip or intra-chip alternate is different from a redundant storage region used for defect rescue in a device process.

As a candidate for a alternate destination nonvolatile memory used in inter-chip alternate, such a nonvolatile memory can be adopted that has the remaining storage regions that can be adopted as a alternate destination as many as a number larger than a predetermined number. If there is none of said candidates that can be adopted, another candidate can be adopted that has the storage regions that can be adopted as a alternate destination as many as the predetermined number or less. If a write-in error occurred in a storage region, preferably the operation of writing such data that is related to the write-in error into such a region that substitutes for this storage region related to the write-in error does not compete with an operation of writing other data, which can be made possible when the writing operation is best performed to the nonvolatile memory where this write-in error occurred.

(2) Interleaved writing: In a case where in the above-mentioned nonvolatile storage system said control unit can control interleaved writing for responding to a data write-in request from an external device to thereby sequentially write write-in data in units of a predetermined data quantity into a plurality of nonvolatile memories as shifting the operation timing, when having detected a write-in error during an interleaved writing operation, as another nonvolatile memory that substitutes for a storage region related to the write-in error, it excludes such a series of nonvolatile memories including a nonvolatile memory where said write-in error occurred that are made a subject for interleaved writing.

By doing so, the operation of writing data related to a write-in error into a alternate region can be prevented from competing with an interleaving operation of writing sub-divided other data. At least, such competition can be eliminated easily at a high probability.

From another detailed aspect on interleaved writing, when having detected a write-in error during the interleaved writing operation, as another nonvolatile memory that substitutes for a storage region related to the write-in error, said control unit may select the first candidate from among such nonvolatile memories that are each distant in interleaving order from the preceding and following ones by a predetermined number of two or more.

If said first candidate cannot be selected, said control unit may select such a second candidate that can be adopted as a alternate destination from among such nonvolatile memories of those outside a range in which said first candidate is selected that follow said first candidate in interleaving order.

If said second candidate cannot be selected, said control unit adopts as a third candidate for a alternate destination a nonvolatile where a write-in error occurred.

If said third candidate cannot be selected, said control unit selects such a fourth candidate that can be adopted as a alternate destination from among such nonvolatile memories of those outside the range in which said first candidate is selected that precede said first candidate in interleaving order.

(3) Parallel writing: When parallel writing is used in place of interleaved writing, said control unit can control parallel wiring for responding to a data write-in request from an external device to thereby write write-in data in units of predetermined data quantity to a plurality of nonvolatile memories concurrently, so that when having detected a write-in error during parallel writing, it selects the first candidate for another nonvolatile memory that substitutes for a storage region related to said write-in error, from a range excluding the parallel-writing subject nonvolatile memories including the nonvolatile memory where said write-in error occurred.

(4) The following will describe a nonvolatile memory related to the present invention from a further aspect. A nonvolatile storage system comprises a control unit and a plurality of nonvolatile memories. Said control unit receives data and address information from an external device to then control the storing of the data received from said external device into said plurality of nonvolatile memories, the reading out of the data thus stored in said nonvolatile memories, and the erasing of the data stored in said nonvolatile memories, while said nonvolatile memories each respond to an operation instruction from the control unit to thereby perform a write-in operation of storing data supplied from said control unit, a read-out operation of reading the stored data and supplying it to the control unit, and an erasure operation of erasing the stored data. The control unit then sub-divides the data received from the external device into data portions of a predetermined size and performs an interleaving operation of supplying the first nonvolatile memory with the first one of thus sub-divided data portions together with a write-in operation instruction and supplying the second nonvolatile memory with the second data portion together with a write-in operation instruction while data is being written to the first nonvolatile memory, thus sequentially supplying all of these sub-divided data portions to the plurality of nonvolatile memories. If a write-in error occurred while predetermined data is being written to any one of the plurality of nonvolatile memories, when having detected the write-in error, the control unit controls data storage in supplying said predetermined data together with a write-in operation instruction to the nonvolatile memory engaged in the write-in operation and also to other nonvolatile memories except those to which sub-divided data portions are to be written after the occurrence of the write-in error.

The nonvolatile memories each have a plurality of memory cells, a plurality of word lines, and a plurality of bit lines. Said plurality of memory cells are positioned at the respective intersections between the corresponding word lines and bit lines. The memory cells connected to the respective word lines are classified into, for example, a first group and a second group so that the memory cells of the first group may be used for storing the data supplied from the control unit and the memory cells of the second group may be used for storing predetermined information. The predetermined information contains such information that indicates whether a write-in error occurred when the predetermined data was being stored into any memory cell connected to the relevant word line during the write-in operation and such information that indicates a nonvolatile memory that stored the predetermined data when the write-in error occurred.

The predetermined size of the sub-divided data portions is, for example, such that they can be stored in any of the memory cells of the first group. The write-in, read-out, and erasure operations are performed for each of said word lines, for example.

The memory cells each store data therein based on a threshold voltage that corresponds, for example, to the data to be stored, while the write-in operation comprises a first operation of changing a threshold voltage for each memory cell to a threshold voltage that corresponds to data to be stored and a second operation of confirming whether the threshold voltage for each memory cell has been changed to the corresponding threshold voltage and repeats the first and second operations. In this operation, the write-in error is detected when it is detected that after the first and second operations are repeated a predetermined number of times, the threshold voltage of at least one memory cell has not been changed to the corresponding threshold voltage.

When the write-in error is detected in the write-in operation, the nonvolatile memory posts the occurrence of the write-in error to the control unit, which in turn gives a write-in operation instruction to the other nonvolatile memories after writing data to the relevant nonvolatile memory where the write-in error occurred by specifying a word line different from that involved in writing when the write-in error occurred.

If rescued by redundant means at the stage of a device process, said nonvolatile memory notifies said control unit of the occurrence of a write-in error after writing data through the redundant means by specifying a word line different from that involved in writing when said write-in error occurred.

The above-mentioned and other objects and the novel features of the present invention will become apparent from the description of the present specification and the accompanying drawings.

DESCRIPTION OF THE EMBODIMENTS
(ATA Memory Card)

Figure 1:
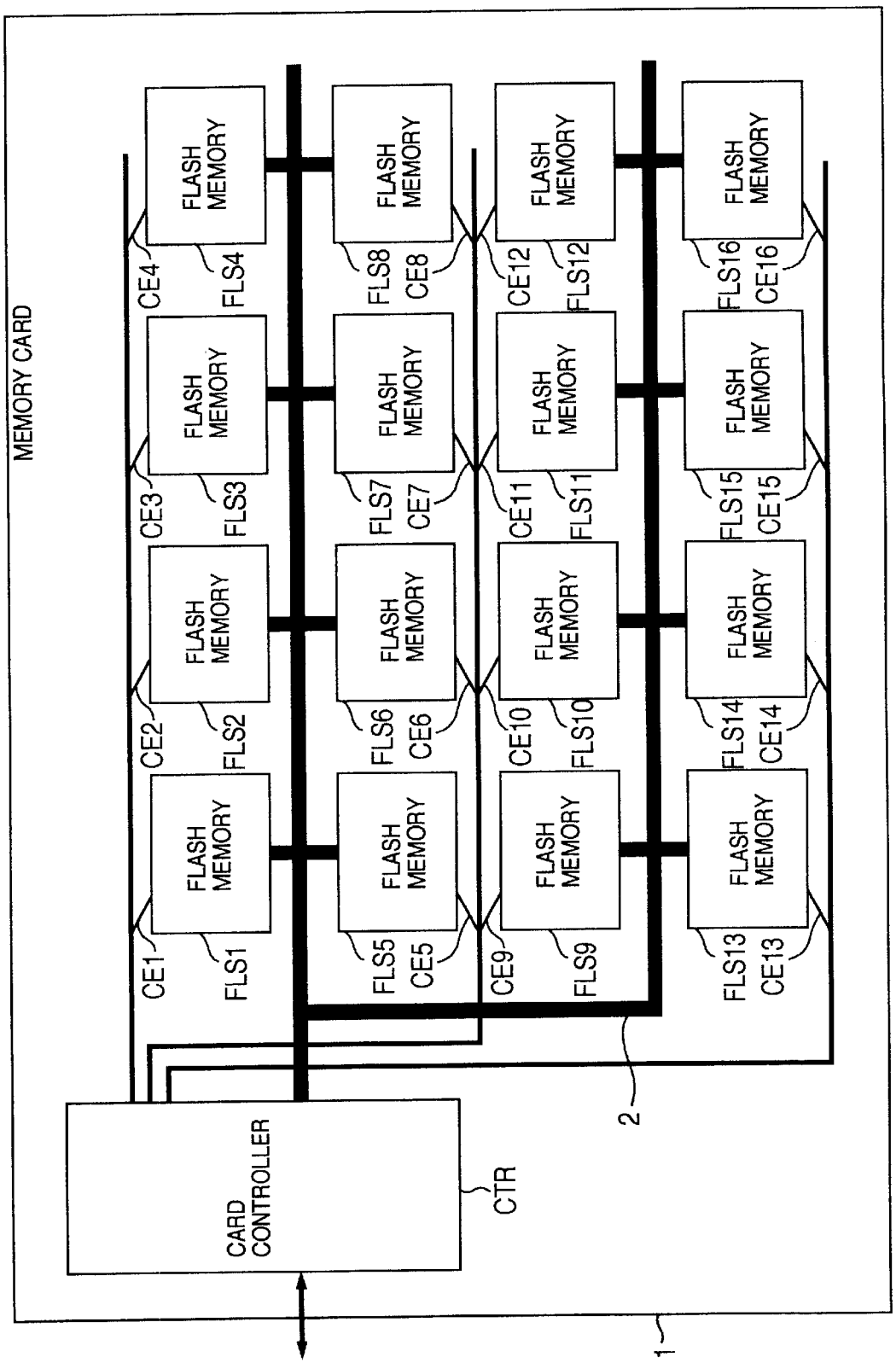
FIG. 1 is a block diagram for showing an ATA memory card built in a flash memory according to one example of a nonvolatile memory related to the present invention.

FIG. 1 is a block diagram for showing an ATA memory card built in a flash memory (referred to also as ATA memory card simply) according to one example of a nonvolatile memory related to the present invention. A memory card 1 shown in the figure comprises a card substrate not shown and a plurality of flash memories FLS1 through FLS16 (arbitrary one of which is referred to as flash memory FLSi), which are one example of a nonvolatile memory capable of read-out, erasure, and write-in operations and a card controller CTR, which is one example of a control unit for controlling the operations of said plurality of flash memories in response to a request from an external device which are both mounted on the card board. The flash memories FLS1 through FLS16 and the card controller CTR are connected commonly, but not exclusively, to a bus 2 so that the flash memories FLS1 through FLS16 may be selected in operation by the inherent CHIP ENABLE signals CE1 through CE16 (arbitrary one of which is referred to as CHIP ENABLE signal CEi) respectively. Said bus (I/O bus) 2 is used to transfer addresses, data, access strobe signals, and commands.

Figure 2:
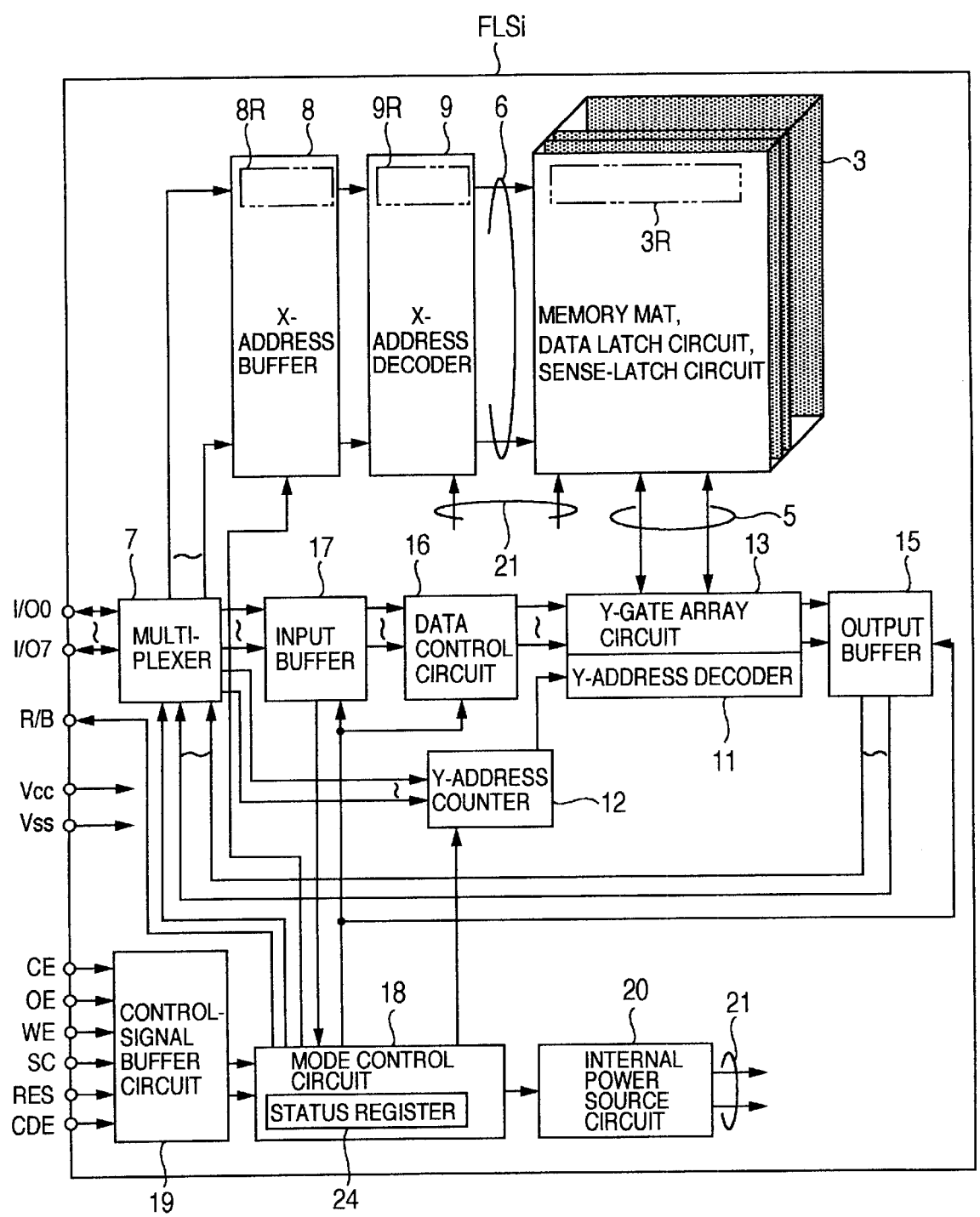
FIG. 2 is a block diagram for showing one example of a flash memory.

FIG. 2 is a block diagram for showing one example of the flash memory FLSi. In this figure, a memory array 3 has a memory mat, a data latch circuit, and a sense-latch circuit. This memory mat has a large number of nonvolatile memory cell transistors capable of electrical erasure and write-in operations. The memory cell transistors (which are also referred to as flash memory cells) each comprise, not particularly shown though, a source and a drain which are formed in a semiconductor substrate or a well, a floating gate formed in a channel region between said source and drain with a tunnel oxide film, and a control gate superposed on the floating gate via an inter-layer insulator film. The control gate is connected to a word line 6, the drain is connected to a bit line 5, and the source is connected to a source line not shown. In the memory cell transistor, when an electron is injected to the floating gate thereof, the threshold voltage increases and when the electron is removed from the floating gate, the threshold voltage decreases. As such, the memory cell transistor stores information that corresponds to the high or low threshold voltage as compared to the voltage of the word line (which is applied to the control gate) for read-out of data. The present specification defines typically, but not exclusively, such states that the threshold voltage of a memory cell transistor is low and high as the erased state and the written-in state respectively.

External I/O terminals I/O0 through I/O7 of the flash memory 1 connected to said bus 2 are used commonly as an address input terminal, a data input terminal, a data output terminal, and a command input terminal. The X-address signals input from the external I/O terminals I/O0 through I/O7 are supplied via a multiplexer 7 to an X-address buffer 8. An X-address decoder 9 decodes the complementary internal address signals output from the X-address buffer 8 to thereby drive the word line.

On the side of one ends of said bit lines 5 is provided the sense-latch circuit, while on the side the other ends thereof is provided the data latch circuit. The bit line 5 is selected by a Y-gate array circuit 13 based on a select signal output from a Y-address decoder 11. The Y-address signals input from the external I/O terminals I/O0 through I/O7 are present to a Y-address counter 12, so that the address signals sequentially incremented starting from a preset value are given to said Y-address decoder 11.

A bit line selected by the Y-gate array circuit 13 is connected to the input terminal of an output buffer 15 to output data and connected to the output terminal of a data control circuit 16 via an input buffer 17 to input data. The interconnection between the output buffer 15 and the input buffer 17 and said I/O terminals I/O0 through I/O7 is controlled by said multiplexer 7. A command supplied from the I/O terminals I/O0 through I/O7 is given to a mode control circuit 18 via the multiplexer 7 and the input buffer 17.

A control signal buffer circuit 19 is supplied with such access control signals as the CHIP ENABLE signal CEi, the OUTPUT ENABLE signal OEi, the SERIAL CLOCK signal SC, the RESET signal RESi, and the COMMAND ENABLE signal CDEi. According to these signals the mode control circuit 18 controls an external signal interfacing function etc. and also, according to an input command it controls the internal operations. To input a command or data to the I/O terminals I/O0 through I/O7, said signal CDEi is asserted and moreover, to input a command, further the signal WEi is asserted, and to input data, the signal WEi is negated. To input an address, said signal CDEi is negated and said signal WEi is asserted. As such, the mode control circuit 18 can discriminate among commands, data, and addresses input as multiplexed from the external I/O terminals I/O0 through I/O7. The mode control circuit 18 can notify the external device of its state by asserting the READY/BUSY signal R/Bi in the erasure or write-in operation mode.

An internal power source circuit (internal voltage generating circuit) 20 generate an operating power source 21 which serves as various internal voltages for write-in, erasure, verification, and read-out operations to then supply it to the X-address decoder 9, memory cell array 3, etc.

The mode control circuit 18 controls the flash memory FLSi as a whole according to the input command. The operations of the flash memory FLSi are basically determined by the command. The commands for the flash memory 1 include a read-out command, an erasure command, a write-in command, etc.

The flash memory FLSi has a status register 24 to indicates its own internal state, the contents of which can be read out through the I/O terminals I/O0 through I/O7 by asserting the signal OEi.

As redundant means for rescuing a faulty memory cell transistor which was detected to be faulty at the stage of device manufacture, the flash memory FLSi has, for example, a redundant program circuit 8R, a redundant X-address decoding logic 9R, and a redundant memory array 3R to thereby redress faulty transistors for each word line. Said redundant program circuit 8R has faulty X-addresses to be rescued programmed therein, so that when having detected an input of an X-address coincident with any one of thus programmed faulty X-addresses, it output a detection signal to the X-address decoder 9. When said detection signal is activated, said X-address decoder 9 deactivates the regular X-address decoding logic to activate the redundant X-address decoding logic 9R instead, in order to input from the redundant program circuit 8R such redundant addresses assigned to rescue the currently faulty address and decode them, thus selecting a redundant word line in the redundant memory array 3R.

Figure 3:
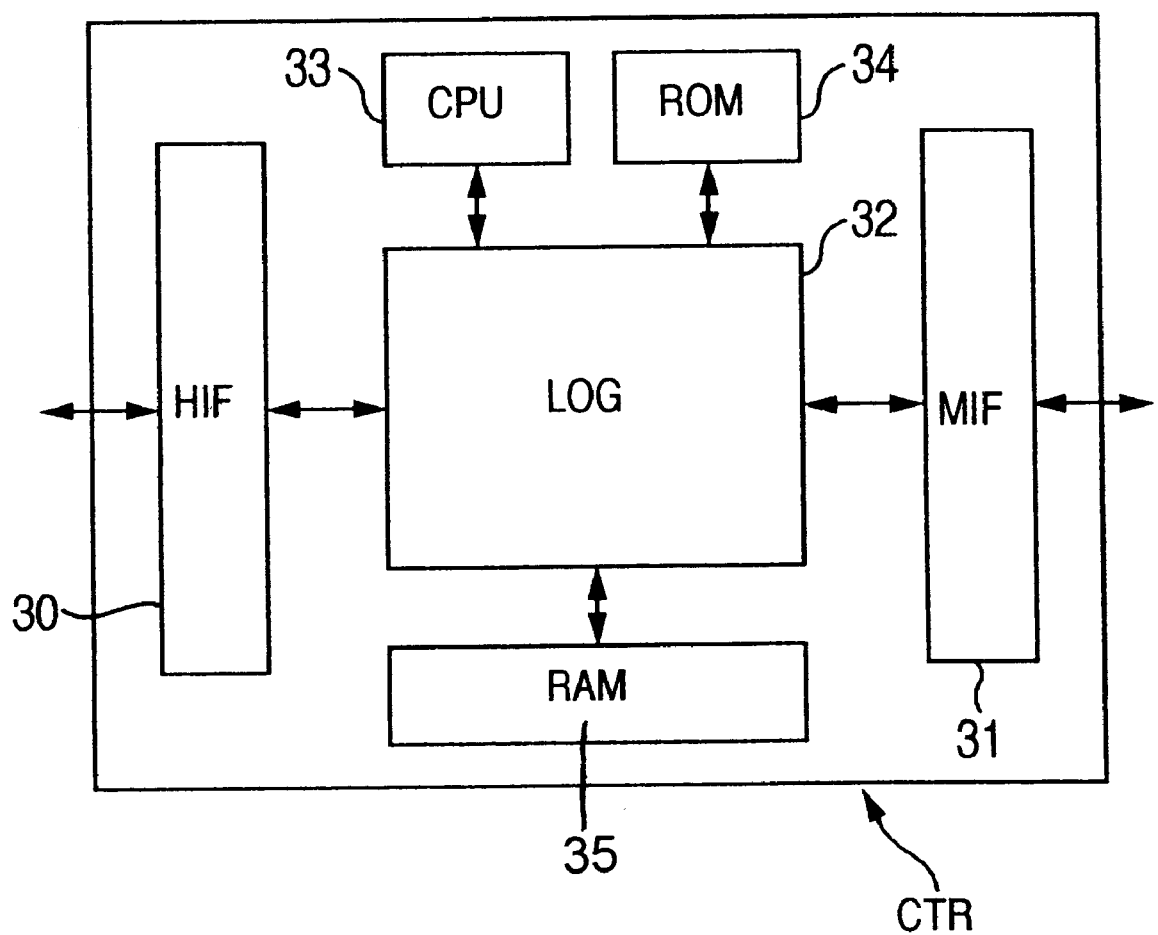
FIG. 3 is a block diagram for showing one example of a card controller.

FIG. 3 shows one example of the card controller CTR. The card controller CTR comprises a host interface (HIF) 30 connected to a host system and a memory interface (MIF) 31 connected via said bus 2 to the flash memories FLS1 through FLS16 and also has a control logic circuit 32 disposed at the center as surrounded by these in such a configuration that this control logic circuit 32 is connected with a Central Processing Unit (CPU) 33, a Read Only Memory (ROM) 34, and a Random Access Memory (RAM) 35. The CPU33 responds to an access request etc. given from the host system to thereby execute a program stored in the ROM34, thus controlling the interface with the host system and that with the flash memories. The RAM35 is utilized as a work region and a control table region for the CPU in such interface control. The control logic circuit 32 is dedicated hardware for realizing a host interface function, a memory interface function, an error detection/correction function, and a data transfer control function in order to partially participate in the software processing that can be executed by the CPU33.

The typical functions of the card controller CTR are an access control function to permit the flash memories FLS1 through FLS16 to operate as a file memory according to the ATA interface specifications and a storage region alternate control function to accommodate a fault related to write-in of data to the flash memory FLSi, for example, such a fault that may occur in some of the storage regions. The access control function is compatible with the IDE disk interface specifications and publicly known already; therefore, its detailed explanation is omitted here. The following will describe the alternate control function in detail.

(Alternate Control Function)

Figure 4:
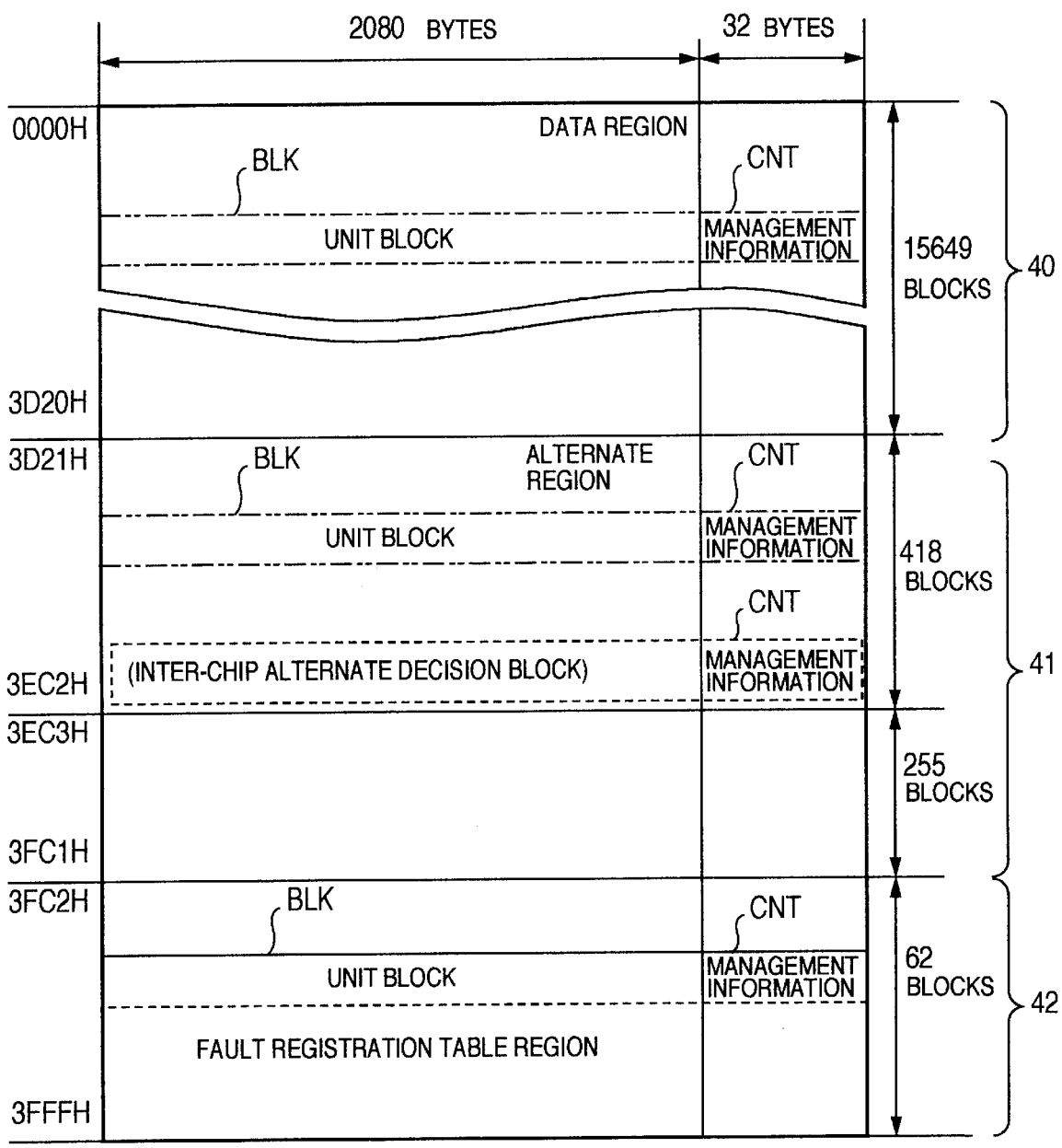
FIG. 4 is an illustration for explaining an example of an address map of a memory mat in the flash memory.

FIG. 4 shows an example of an address map of a memory mat in the flash memory FLSi. This address map indicates just a local one in each flash memory FLSi, which is roughly divided into a data region 40, a alternate region 41, and a fault-registration region 42. Each of these regions has a unit region BLK·CNT with a format typically, but not exclusively, of a unit-block BLK having 4-sector-capacity 2048 (512×4) bytes plus 32-byte ECC code with an addition of 32-byte management information CNT. For example, the data region 40 has 15649 unit regions, the alternate region 41 has 673 unit regions BLK·CNT, and the fault registration region 42 has 42 unit regions BLK·CNT. Note here that each unit region BLK·CNT is provided a redundant redress storage region supposed to be part of the redundant mat 3R for the purpose of rescuing a fault which occurs at the device process stage for the flash memory FLSi, which storage region is mapped to an address to be redressed if redundant redress was performed and, otherwise, not mapped.

The data region 40 is supposed to be opened for, for example, the users. If a write-in error occurred time-wise at the data region 40 etc., the alternate region 41 is used to substitute for the faulty unit region BLK.CNT of this data region 40 etc. The minimum unit for alternate is a unit region BLK.CNT. The alternate region 41 may be utilized not only in intra-chip alternate of the data region 40 etc. in the same flash memory but also in inter-chip alternate of that of other flash memories. The fault-registration table region 42 serves to register the addresses of a alternate destination flash memory and a alternate destination alternate region thereof.

Figure 5:
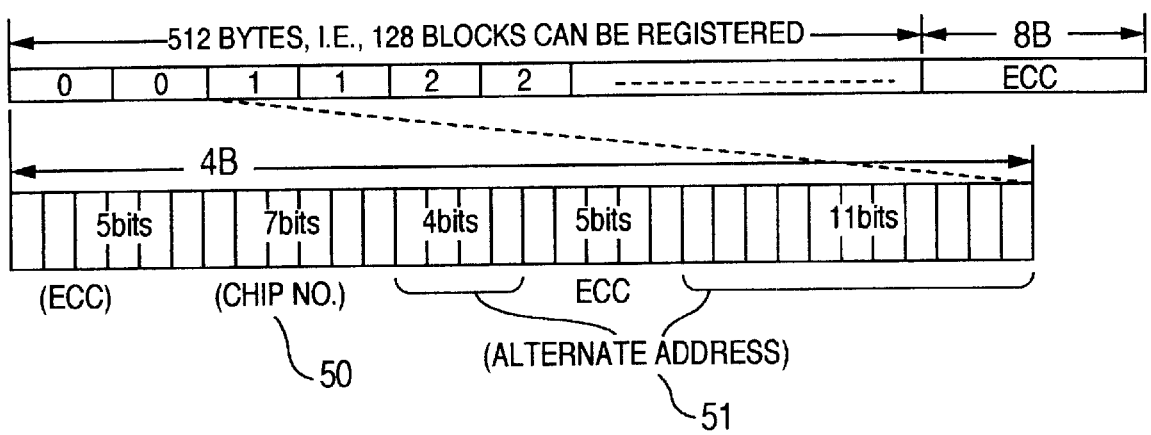
FIG. 5 is an illustration for explaining an example of a fault-registration data format of a fault-registration table.

FIG. 5 exemplifies a fault-registration data format of the fault-registration table 42. The fault registration data for each unit region BLK·CNT consists typically, but not exclusively, of four bytes, which is comprised of a alternate-destination address region 50 for identifying a alternate destination flash memory and an alternate-destination address region 51 for identifying the address of an alternate-destination unit region. An ECC code is disposed for each 11 bits of information. Note here that the alternate destination address is supposed, but not exclusively, to be an offset address with respect to the start address of an alternate region.

The fault registration data for each four bytes and the unit region BLK·CNT is typically, but not exclusively, in one-to-one correspondence. Therefore, by performing address operations based on a physical address of a unit region BLK·CNT, the corresponding fault registration data for each four bytes can be obtained. Such address operations are performed by the card controller CTR.

Figure 6:
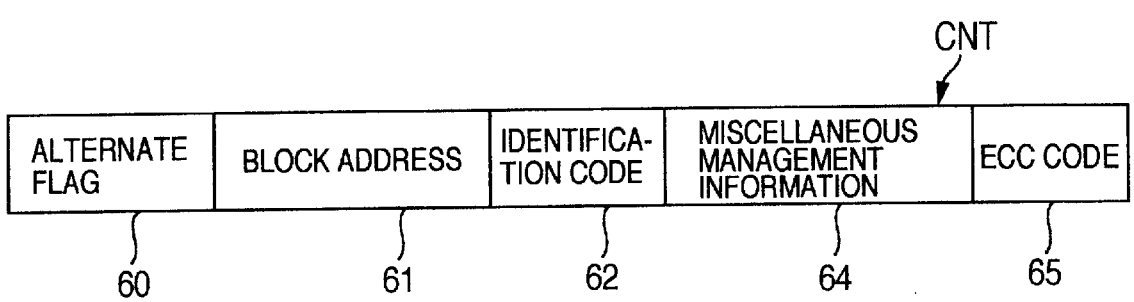
FIG. 6 is an illustration for explaining an example of an information format of management information.

FIG. 6 exemplifies an information format of said management information CNT. The management information CNT has a alternate flag 60, a block address 61, an identification code 62, a miscellaneous management information 64, and an ECC code 65. The alternate flag 60 includes a predetermined code to indicate that the corresponding unit region BLK·CNT has not been replaced but, if its bits are all "1", it indicates that the corresponding unit region BLK·CNT has been replaced by the alternate region 41. The block address refers to a local memory address (physical address) assigned to the relevant unit region BLK·CNT. The identification code indicates whether the unit block BK consists of data or control information etc. The miscellaneous management information may include, for example, a physical address of a alternate source (error occurrence source) in a alternate destination unit region BLK·CNT.

The following will describe how the card controller controls the alternate of the unit region BLK·CNT.

The card controller CTR recognizes a specific address of the alternate region 41, for example, a physical address "3EC2 'H" (symbol 'H stands for hexadecimal) as an inter-chip alternate decision block address. That is, when accessing a unit region, the card controller CTR reads in the management information CNT and, if its physical address is lower than "3EC2 'H" in order, in other words, if the alternate region still has a larger number of storage regions capable of alternate than a predetermined number, provides control so as to perform intra-chip alternate when a write-in error occurred in a unit region BLK·CNT thereof. In this alternate control, the bits of the alternate flag of the management information in said unit region BLK·CNT where the write-in error occurred are all set to "1" and, as such faulty registration data for each four bytes that corresponds to that unit region BLK·CNT the number of an alternate destination chip (which is a chip No. of a flash memory where a write-in error occurred because of intra-chip alternate in this case) is written into the region 50, and into the region 51 an alternate destination address is written. In such a manner, the information written into the regions 50 and 51 and the flag 60 constitutes intra-chip alternate information indicating that a unit region BLK·CNT replaced to a write-in error has been replaced by another unit region BLKCNT in the same flash memory.

If the physical address of the read in management information CNT is higher than "3EC2 'H" in order, in other words, if the alternate region 41 now has not more than the predetermined number of storage regions capable of alternate, the card controller CTR provides control so as to perform inter-chip alternate when a write-in error occurred at a unit region BLK·CNT thereof. In this alternate control, the bits of the alternate flag 60 of the management information in the unit region BLK·CNT where the write-in error occurred are all set to "1" and, as such fault registration data for each four bytes that corresponds to that unit region BLKCNT the number of an alternate chip (which is the chip No. of a flash memory different from that where the write-in error occurred because of inter-chip alternate in this case) is written into the region 50 and into the region 51, an alternate destination address is written. In such a manner, the information written into the regions 50 and 51 and the flag 60 constitutes inter-chip alternate information indicating that a unit region BLK·CNT related to a write-in error has been replaced by a unit region BLK·CNT of a different flash memory.

When having read in the management information CNT of a unit region BLK·CNT specified by an address from an access-subject flash memory to thereby recognize that the unit region has been replaced already (that the bits are all at "1") based on the flag 60 of thus read in management information CNT, the card controller CTR reads in such fault registration data for each four bytes that corresponds to that unit region BLK·CNT to thereby change to the access subject the alternate destination address in a flash memory of a chip No. specified by the regions 50 and 51 of that fault registration data, thus providing access control.

Of course, the alternate region used in said inter-chip or intra-chip alternate is different from a redundant alternate region such as the redundant array 3R used in defect rescuing during a device process. A rescue operation in accordance with the program contents of the redundant program circuit involves automatic alternate with redundancy in accordance with the hardware of a flash memory as far as redundancy alternate is performed, irrespective of whether inter-chip or intra-chip alternate is performed or not.

As can be seen from the above description of the alternate control function, it is possible to rescue a write-in error which occurred at one flash memory using inter-chip alternate utilizing the alternate region of another flash memory. Therefore, even if some of the flash memories are rendered incapable of replacing their internal faulty data regions 40 with the alternate region, it is possible to avoid an overall fault without replacing the faulty nonvolatile memories or using a preliminary nonvolatile memory.

If a write-in error occurred in a nonvolatile memory in which the number of the remaining storage regions capable of new placement has decreased to a predetermined number or less, inter-chip alternate can be allowed for that memory to thereby perform inter-chip alternate, thus eliminating waste of the data blocks as much as possible. That is, by starting inter-chip alternate before such a nonvolatile memory appears that is exhausted to such an extent that intra-chip alternate is no longer possible, the remaining regions capable of new alternate hardly have a large deviation among themselves, thus making it possible to minimize the number of processing cycles required for inter-chip alternate and intra-chip alternate. This is because, if there is a large deviation in the number of the regions capable of new alternate among nonvolatile memories, the number of such nonvolatile memories of these that can be adopted as a alternate destination is decreased, to increase the number of times of making retrieval retrials for looking for such a nonvolatile memory that can be adopted as an inter-chip alternate destination.

It is thus possible to or improve the redressing efficiency for write-in errors occurring time-wise without replacing a faulty nonvolatile memory or using a preliminary nonvolatile memory, thus utilizing the storage regions of each of the nonvolatile memories without waste in alternate of faulty data blocks.

(Alternate Control Function in the Case Where Inter-leaved Writing is Supported)

The following will describe the alternate control function in the case where interleaved writing is adopted.

Figure 7:
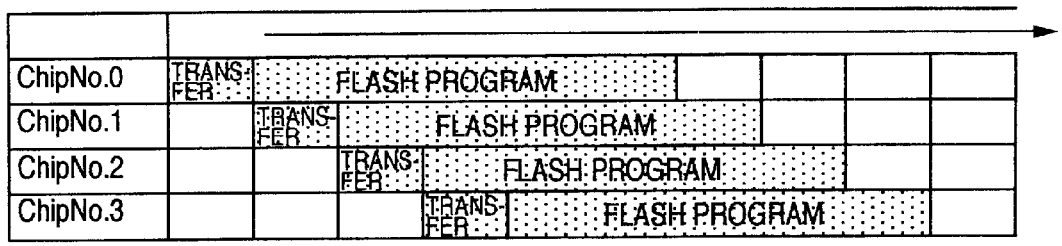
FIG. 7 is an illustration for explaining a concept of an interleaved writing method.

FIG. 7 shows one example of an interleaved writing method. By the interleaved writing method, in response to a data write-in request sent from the host system, the card controller CTR writes write-in data in units of a predetermined data quantity, for example, 2080 bytes into a plurality of different flash memories sequentially as shifting the write-in timing. In FIG. 7, "transfer" indicates an operation of transferring a command and a write-in data from the card controller to a flash memory and "flash program" indicates an operation of writing to a flash memory and verifying this writing. As can be seen from the figure, flash memory Chip Nos. 0–3 are involved sequentially in transferring of a command and write-in data in serial so that the data may be written sequentially at shifted timings according to the transferred command.

Figure 8:
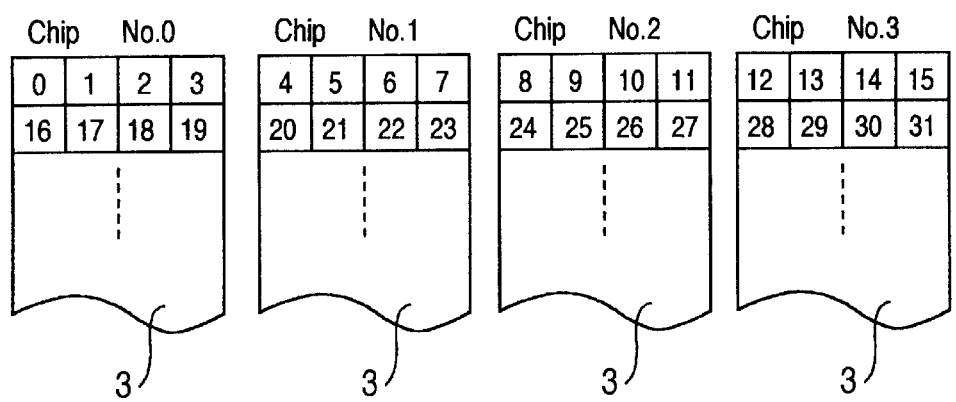
FIG. 8 is an illustration for explaining an example of a state where sector-unit logical addresses of write-in data are distributed to a plurality of flash memories in interleaved writing.

The sector-unit logical addresses of write-in data employed in such interleaved writing are distributed over a plurality of flash memory Chip Nos. 0–3 as exemplified in FIG. 8. In FIG. 8, numerals 0, 1, 2 and 3 indicate a sector-unit logical address of the data.

FIGS. 9–12 exemplify a method for selecting a alternate destination flash memory in inter-chip alternate processing in a case where interleaved writing is employed. These figures are based on a premise that 64 flash memory chips of Chip Nos. 0–63 are mounted in the system. In these figures, A double circle indicates flash memory Chip1 where a write-in error occurred to necessitate inter-chip alternate (inter-chip alternate-required chip). A black dot indicates a flash memory that itself needs to be replaced and cannot accept a request from any other flash memories for alternate (inter-chip alternate-request unacceptable chip). A white circle indicates a flash memory that is capable of intra-chip alternate and that can accept a request from any other flash memories for alternate (inter-chip alternate-request acceptable chip). A white square indicates a series of interleaving-subject flash memories that possibly include said inter-chip alternate chip (interleaving-expected chip). In this case, the number of the series of interleaving-subject flash memories is supposed to be six. A black square indicates a flash memory that is one of said interleaving-expected chips and also that rejects a request for inter-chip alternate.

Figure 9:
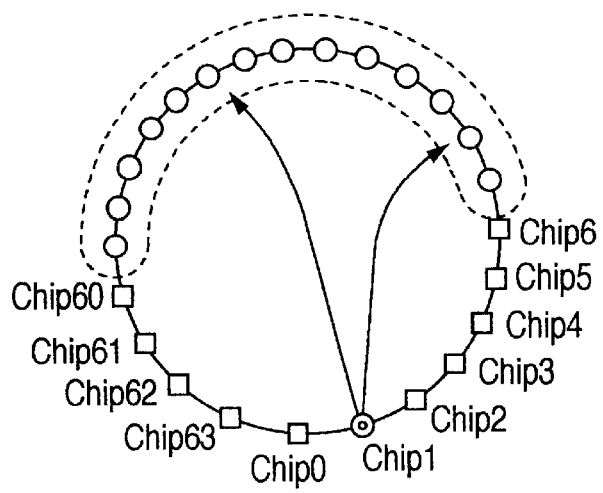
FIG. 9 is an illustration for explaining a alternate method in a case where there is an inter-chip alternate-request acceptable chip as one example of a method for selecting an inter-chip alternate destination flash memory when interleaved writing is employed.

FIG. 9 exemplifies a alternate method when there is an inter-chip alternate-request acceptable chip. When having detected a write-in error at the flash memory Chip1 during an interleaved write-in operation, the card controller CTR selects as another flash memory that substitutes for a storage region related to the write-in error the first candidate for a alternate subject from among the inter-chip alternate-request acceptable chips indicated by a white circle except a series of interleaved writing-subject flash memory Chip1 through Chip6 including said flash memory Chip1 where the write-in error occurred and Chip60 through Chip63. The selection algorithm for selecting the first candidate from among the inter-chip alternate-request acceptable chips is preferably random as much as possible, for example, in selecting as the first candidate such a flash memory that has such a chip No. or nearest to it that corresponds to the remainder of A/(B−C)

in a selectable range. In this expression, "A" indicates the number of blocks in the data region 40, i.e., 15649, "B" indicates the number of the flash memories, and "C" indicates the chip No. of a flash memory that needs inter-chip alternate.

Thus, when writing data related to a write-in error into the alternate region, it is possible to avoid competition with an interleaving operation of writing any other sub-divided data portions. Or it is possible to easily avoid such competition at a high probability.

Figure 10:
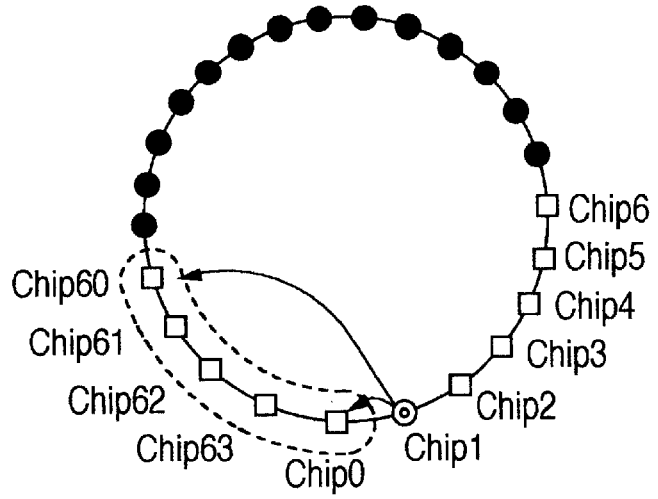
FIG. 10 is an illustration for explaining the alternate method in a case where there is no inter-chip alternate-request acceptable chip as another example of the method for selecting an inter-chip alternate destination flash memory when interleaved writing is employed.

FIG. 10 exemplifies the alternate method in a case where there is no inter-chip alternate-request acceptable chip. When the first candidate cannot be selected, the card controller CTR selects as the second candidate a alternate-request acceptable flash memory from among the flash memory Chip60 through Chip63 following said first candidate in interleaving order outside the selectable range of the first candidate.

Figure 11:
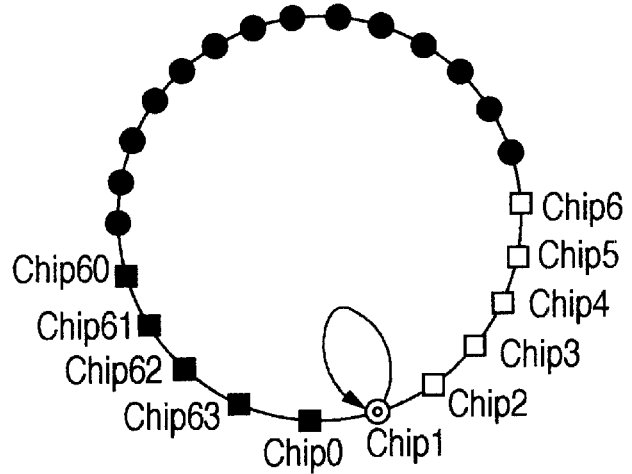
FIG. 11 is an illustration for explaining the alternate method in a case where a second candidate of FIG. 10 cannot be selected as a further example of the method for selecting an inter-chip alternate destination flash memory when interleaved writing is employed.

FIG. 11 exemplifies the alternate method in a case where the second candidate cannot be selected. If said second candidate cannot be selected, the card controller CTR selects the flash memory Chip1 where the write-in error occurred as the third candidate.

Figure 12:
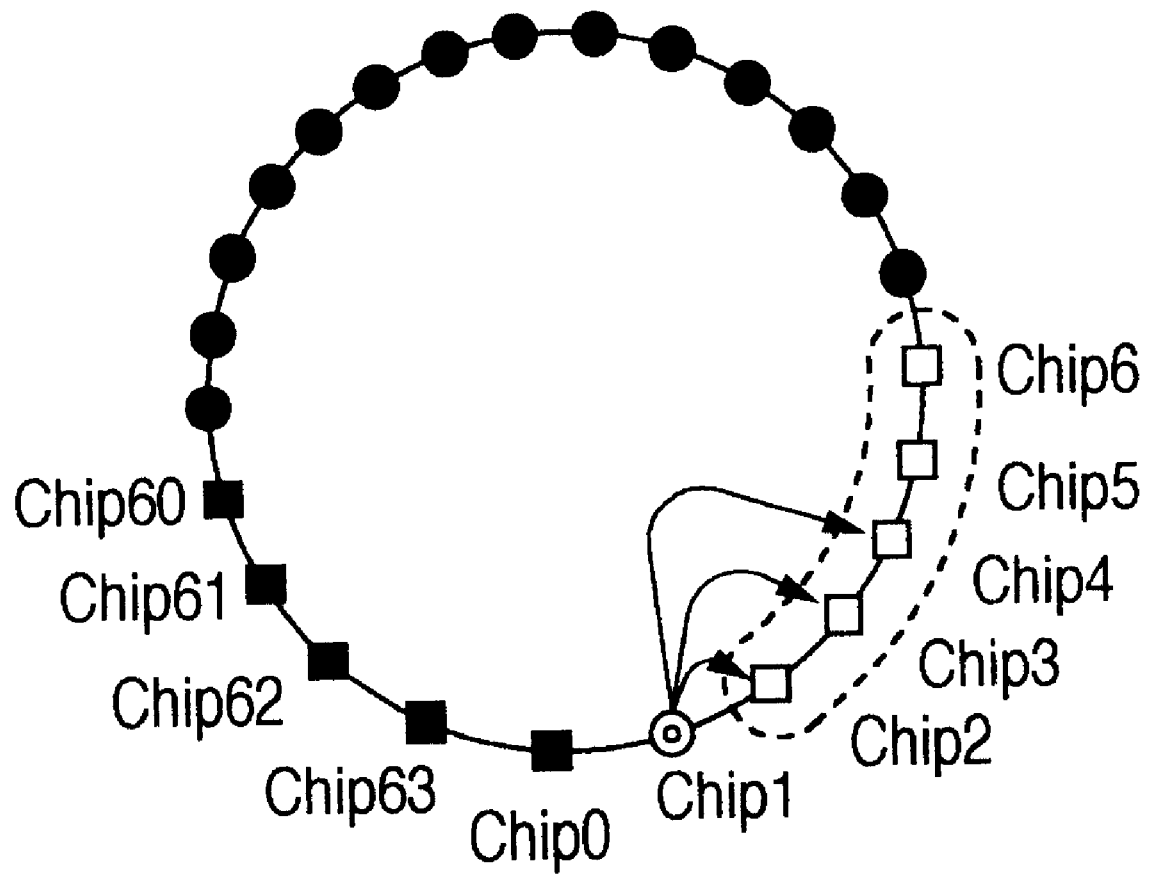
FIG. 12 is an illustration for explaining the alternate method in a case where a third candidate of FIG. 11 cannot be selected as an additional example of the method for selecting an inter-chip alternate destination flash memory when interleaved writing is employed.

FIG. 12 exemplifies the alternate method in a case where the third candidate cannot be selected. If said third candidate cannot be selected, the card controller CTR selects as the fourth candidate a alternate-request acceptable flash memory from among the flash memory Chip2 through Chip6 preceding the third candidate in interleaving order outside the selectable range of the first candidate.

Figure 13:
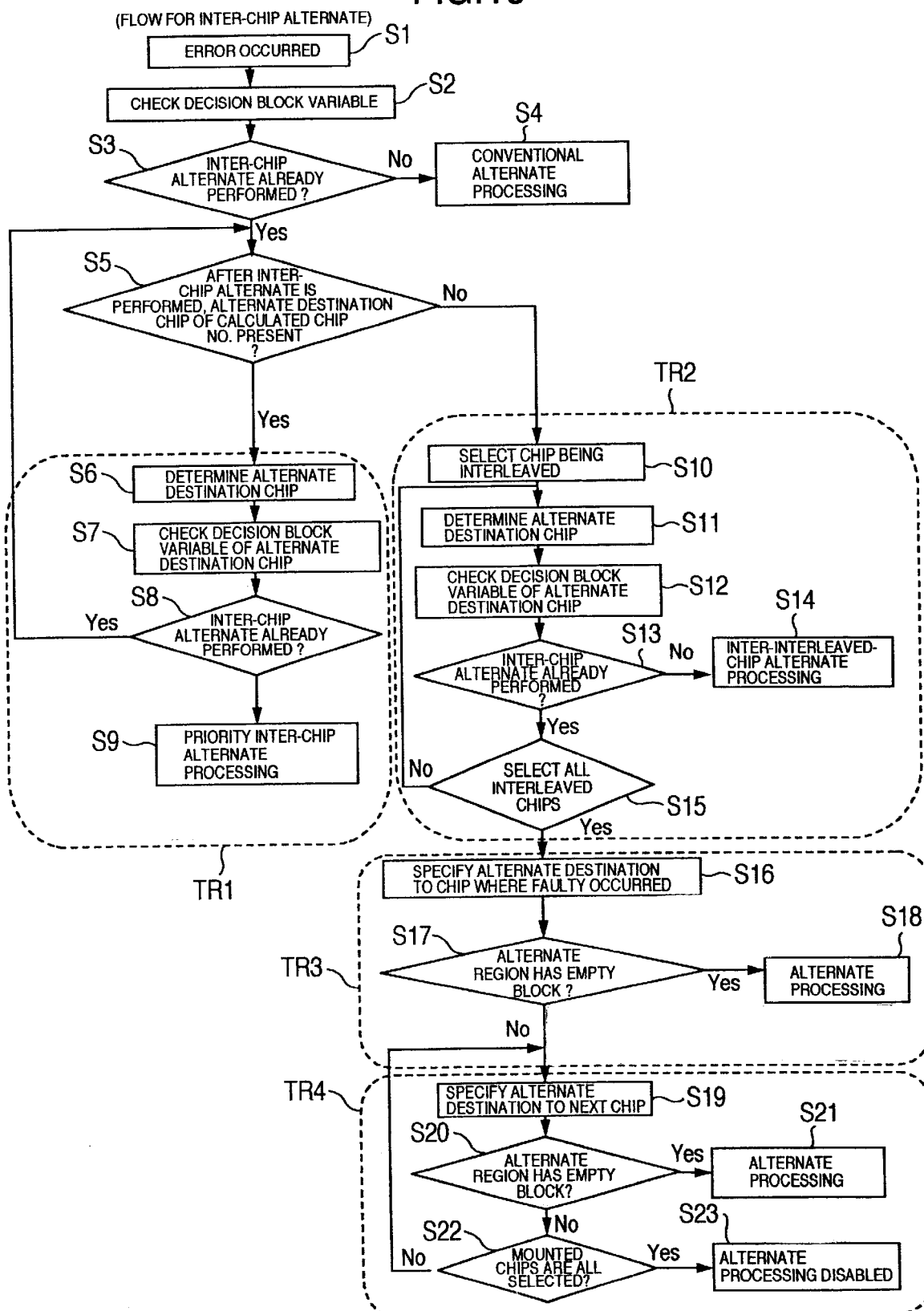
FIG. 13 is a flowchart for showing an inter-chip alternate processing procedure by the card controller for realizing the selection methods explained in FIGS. 9–12.

FIG. 13 exemplifies an inter-chip alternate processing procedure by the card controller for realizing the selecting methods of FIGS. 9–12.

When a write-in error is detected (S1), the process decides a flash memory alternate situation based on the fault-registration table region 42 of a flash memory related to the write-in error and the corresponding management information CNT etc. (S2) to then decide whether inter-chip alternate has reached the inter-chip alternate decision block described in FIG. 4, in short, whether the situation should be accommodated by intra-chip alternate or inter-chip alternate (S3). If the inter-chip alternate decision block is not reached yet, the process performs intra-chip alternate processing (S4).

If having decided at step S3 that the inter-chip alternate decision block was reached, to perform inter-chip alternate processing, the process first decides whether there is the inter-chip alternate-request acceptable chip (S5). If there is any, the process performs the TR1 processing described in FIG. 9. That is, the process selects a candidate for a alternate destination chip (S6), decides the alternate situation of a flash memory expected to be the candidate, based on the fault-registration table region 42 for the selected flash memory and the corresponding management information CNT etc. (S7), and then decides whether the intra-chip alternate situation has reached the intra-alternate decision block described in FIG. 4, in short, whether the situation should be accommodated by intra-chip alternate or inter-chip alternate (S8). If the inter-chip alternate decision block is not reached yet, the process performs the intra-chip alternate processing (S9). Otherwise, the process returns to step S5.

If it is decided at step S5 that there is no inter-chip alternate-request acceptable chip, the process performs the TR2 processing described in FIG. 10. First, the process selects a chip being interleaved (S10). In short, the process selects flash memories that precedes in interleaving order the flash memory where a write-in error occurred. The process selects one of thus selected flash memories as the candidate (S11), decides the alternate situation of a flash memory expected to be the candidate, based on the fault-registration table region 42 for the flash memory selected as the candidate and the corresponding management information CNT etc. (S12), and then decides whether the intra-chip alternate processing has reached the inter-chip alternate decision block described in FIG. 4, in short, whether the situation should be accommodated by intra-chip alternate or inter-chip alternate (S13). If the inter-chip alternate decision block is not reached yet, the process perform the intra-chip alternate processing (S14). Otherwise, the process returns to step S11 unless it has completed processing for all the candidates selected at step S10 (S15).

If an appropriate candidate cannot be selected by the TR2 processing, the TR3 processing described in FIG. 11 is performed. First, the process specifies the alternate destination as a write-in error occurrence chip (s16) and then decides whether the alternate region 41 of the flash memory has an essential blank data block (S17). An essential blank so called here may refer to a situation where alternate has advanced beyond the inter-chip alternate decision block 3, in short, any situation unless the alternate regions are exhausted to the dead end for alternate. If there is any blank, the process performs intra-chip alternate (S18).

If it is decided at step S17 that there is no essential blank, the process performs the TR4 processing described in FIG. 12. First, the process selects as the alternate candidate such a chip that follows immediately in interleaving order (S19) and then decides whether the alternate region 41 of the flash memory has an essential blank data block (S20). An essential blank so called here refers to the same as that at step S17. If there is any blank, the process performs inter-chip alternate (s21). If none of the mounted chips can be selected as the alternate destination candidate (S22), the process decides that alternate processing is impossible to carry out, performs error processing, and ends the series of processing steps (S23).

Figure 14:
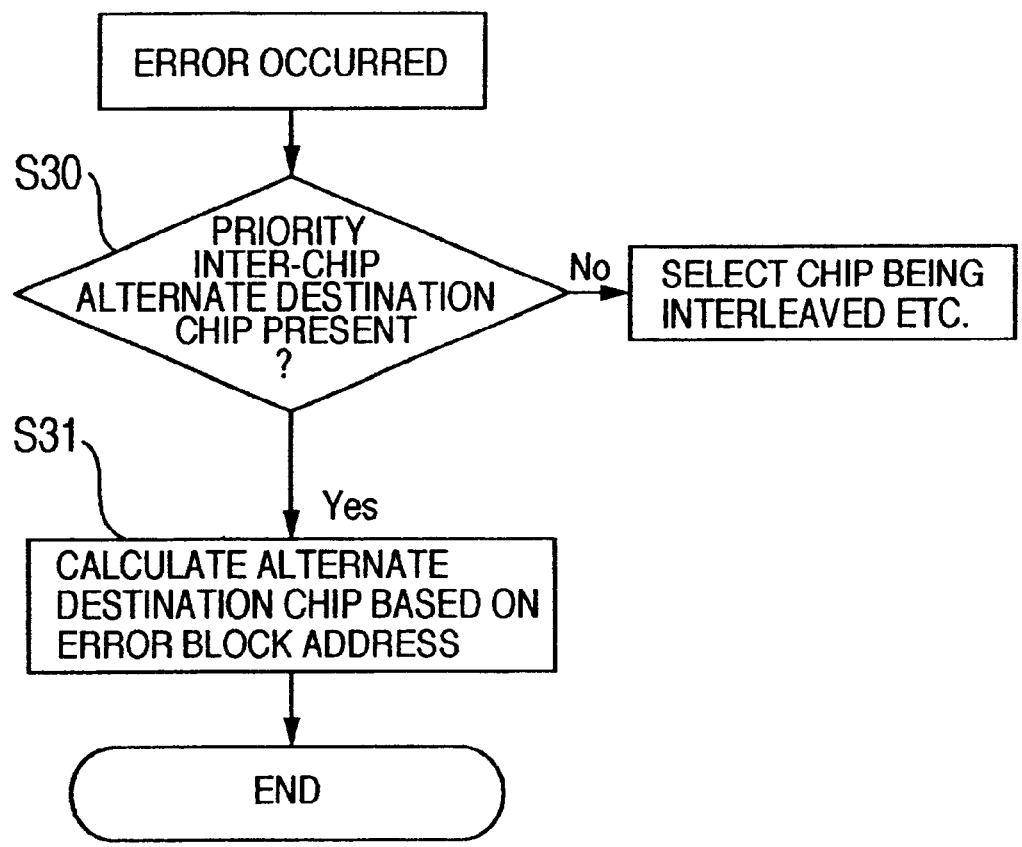
FIG. 14 is a flowchart for exemplifying processing for calculating a alternate destination.

FIG. 14 exemplifies a flowchart for calculating a alternate destination. This processing corresponds to that at step S5. That is, the process decides whether there is said inter-chip alternate-request acceptable chip (S30) and, if there is any, calculates a alternate destination chip based on the write-in error occurrence block address (S31). It is specifically calculated by, for example, dividing the block address by the number of the chips outside the interleaving range and then adding the resultant remainder to the minimum chip No. of these chips outside the interleaving range. More specifically, supposing that Chip No. 7 through No. 59 are outside the interleaving range, the error occurrence chip is Chip No.1, also the error occurrence block address is 10 'H, and the number of the mounted chips is 64, a division of 16÷53 comes up with a remainder of 16 and the minimum Chip No. outside the range is 7, so that an addition of 7+16=23 results in ChipNo. 23 being selected as the inter-chip alternate chip.

Figure 15:
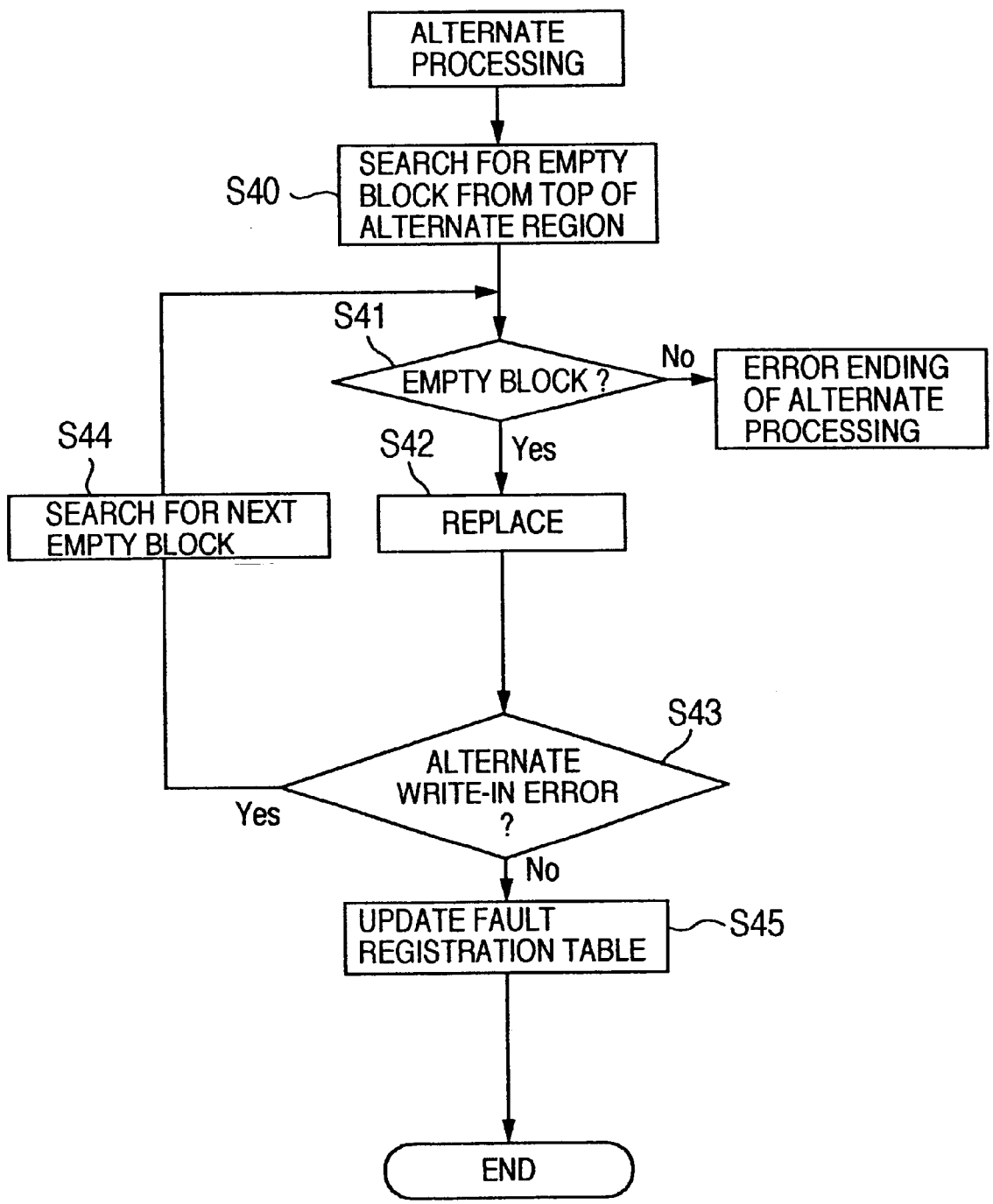
FIG. 15 is a flowchart for exemplifying the alternate processing.

FIG. 15 exemplifies a flow of the alternate processing. This processing corresponds to that for alternate at steps S4, S9, etc. The process searches the alternate region of a flash memory expected to be a alternate candidate for an empty block (S40) to decides whether there is any empty block (S41). If there is none, the process ends because of a alternate error and, otherwise, performs alternate (S42). Specifically, the process writes data related to the error into the alternate destination and, if no write-in error is detected (S43), sets the flag of the corresponding management region and sets the alternate destination address of the corresponding fault-registration table data (S45) and then ends the alternate processing. If a write-in error is detected, the process searches for a next empty block (S44) and then returns to step S41.

Figure 21:
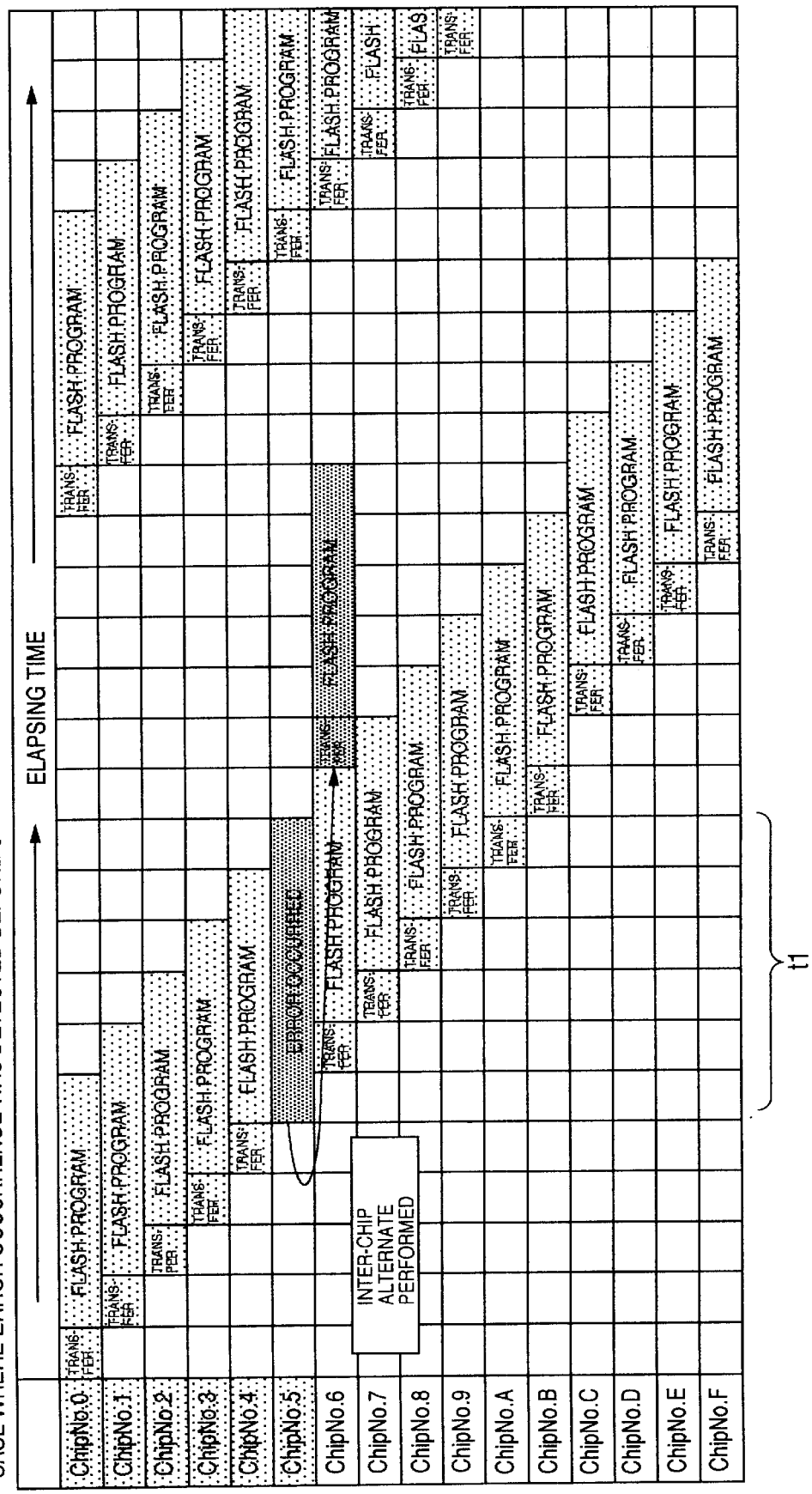
FIG. 21 is another timing chart for showing the case where error occurrence was detected at write-in operation termination as the specific example of the alternate situation realized by the alternate control function when interleaved writing is supported.
Figure 22:
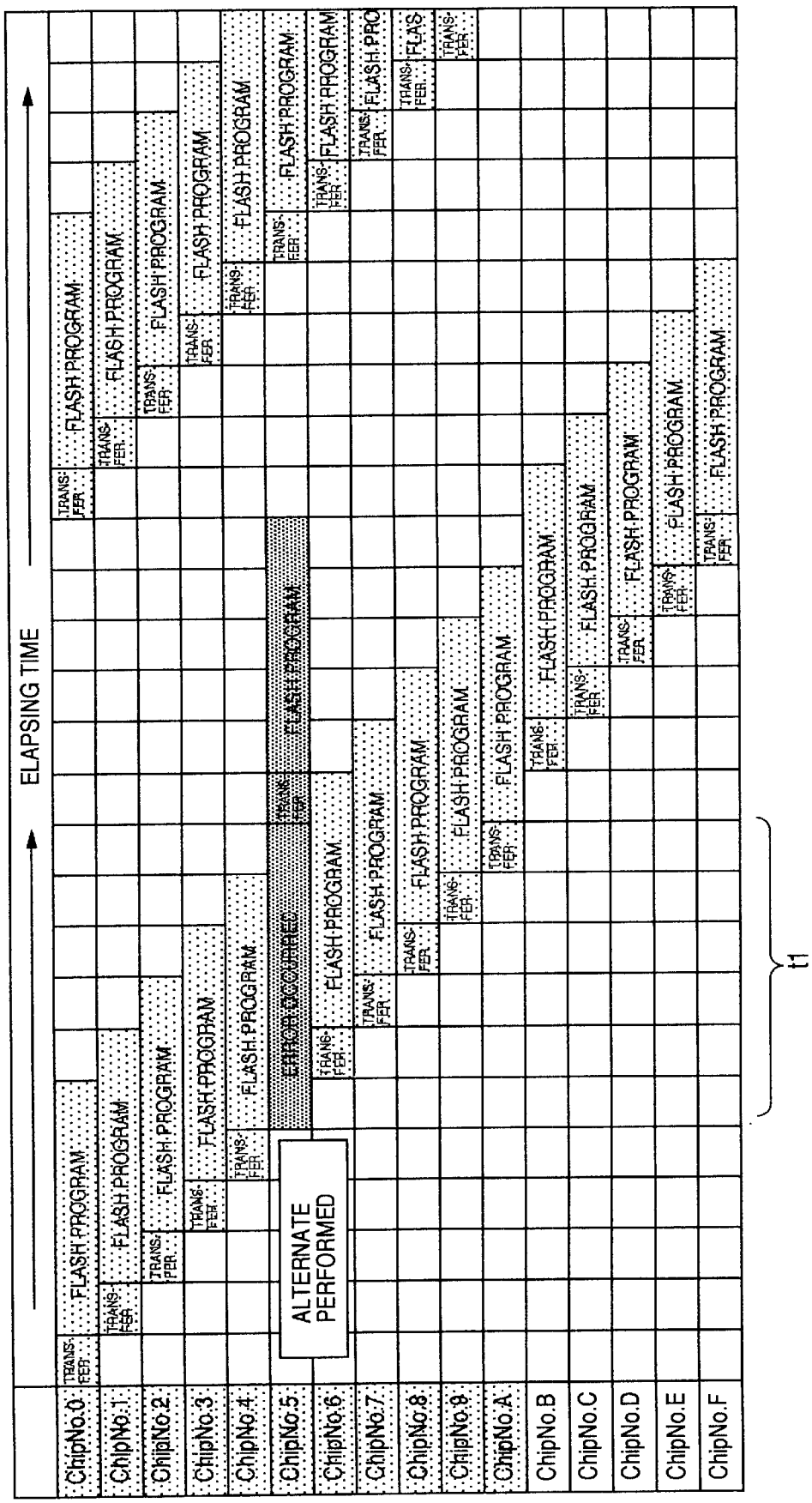
FIG. 22 is a further timing chart for showing the case where error occurrence was detected at write-in operation termination as the specific example of the alternate situation realized by the alternate control function when interleaved writing is supported.
Figure 23:
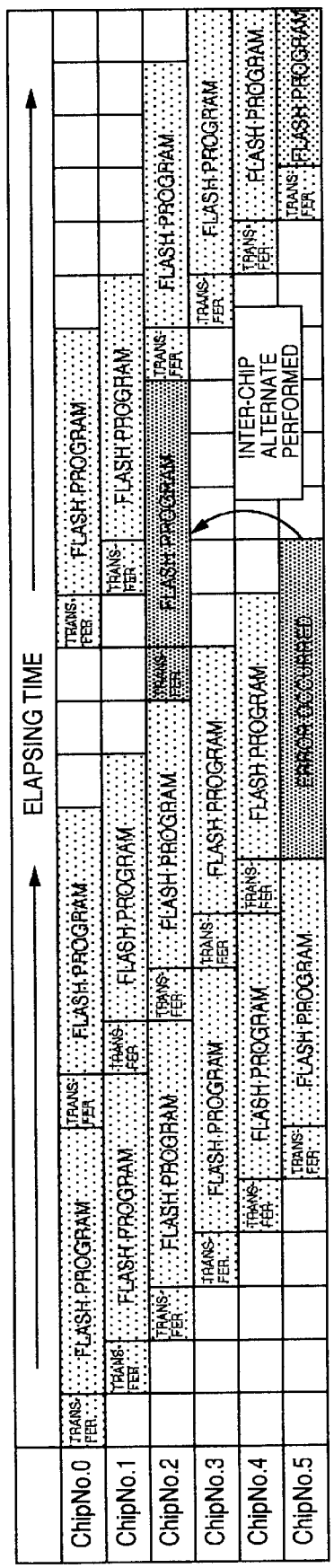
FIG. 23 is a timing chart for showing a case where a small number of chips are mounted as a specific example of the alternate situation realized by the alternate control function when interleaved writing is supported.

FIGS. 16–23 show the respective alternate situations realized by the alternate control function when interleaved writing is supported as described above. FIGS. 16–22 are based on a premise that 16 flash memories of ChipNo. 0 through ChipNo. F are mounted and FIG. 23 is based on a premise that six flash memories of ChipNo. 0 through ChipNo. 5 are mounted.

In FIGS. 16–19, supposedly an error occurrence is detected before programming of the flash memories is started. That is, the management information must be confirmed before a write-in voltage is applied to the nonvolatile memories (programming) to then verify the programmed contents. If, in the case, the write-in subject data block is already replaced, it is necessary to confirm whether a alternate destination address can be obtained before starting said programming and verification of the programmed contents, in which if the faulty registration table to be read out cannot be read due to an EEC error etc., no alternate destination address cannot be obtained, resulting in a write-in error. The occurrence of such a write-in error is premised.

Figure 16:
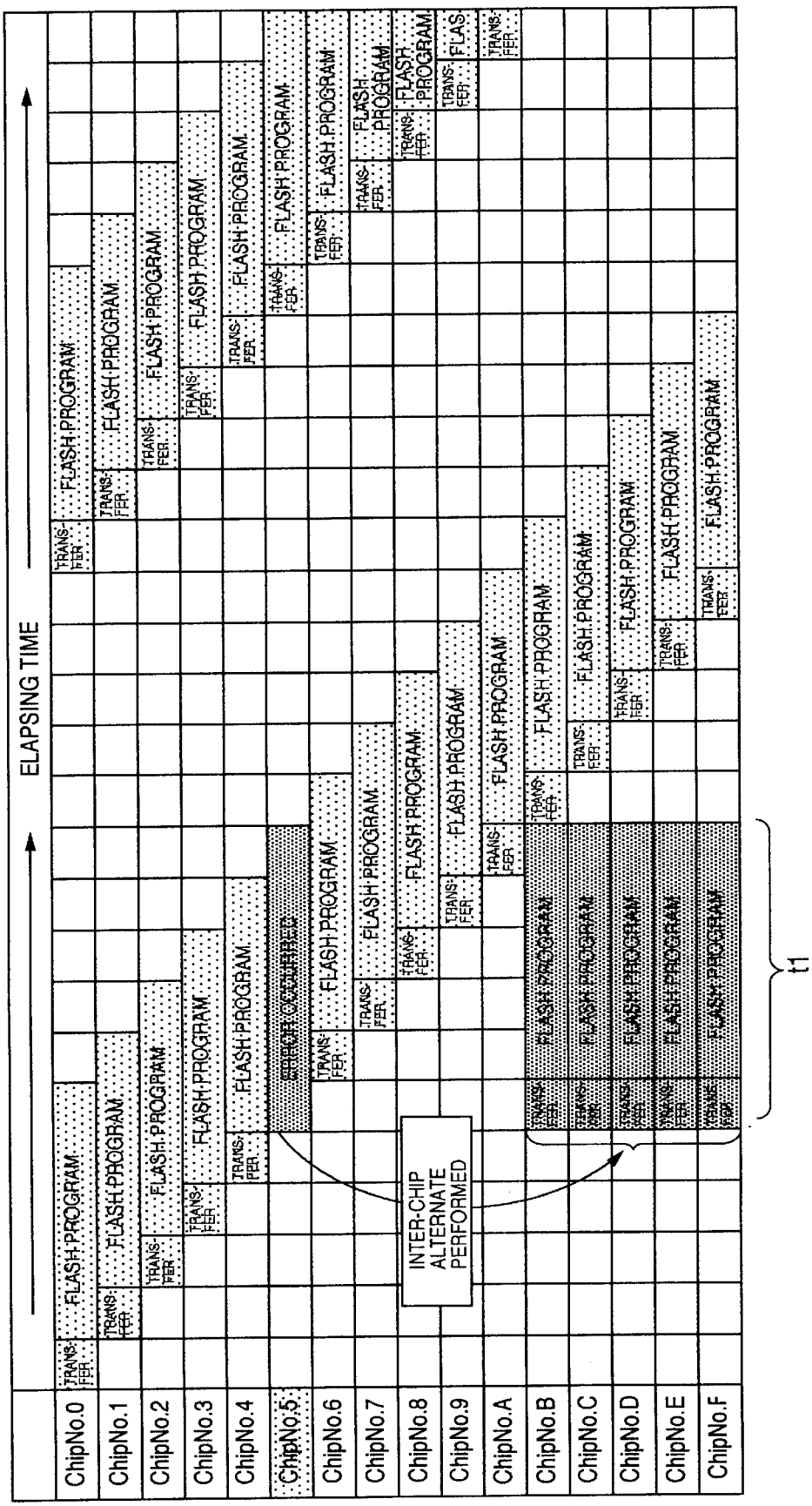
FIG. 16 is a timing chart for showing, as corresponding to a processing result by FIG. 9, a case where error occurrence was detected at an early stage after write-in operation start as a specific example of a alternate situation realized by a alternate control function when interleaved writing is supported.

In FIG. 16, an error occurred at g flash memory of ChipNo. 5. In this case, any one of ChipNo. B through ChipNo. F can be used for alternate during a period t1 that does not interfere with any other interleaving operations. This corresponds to the processing results of FIG. 9.

Figure 17:
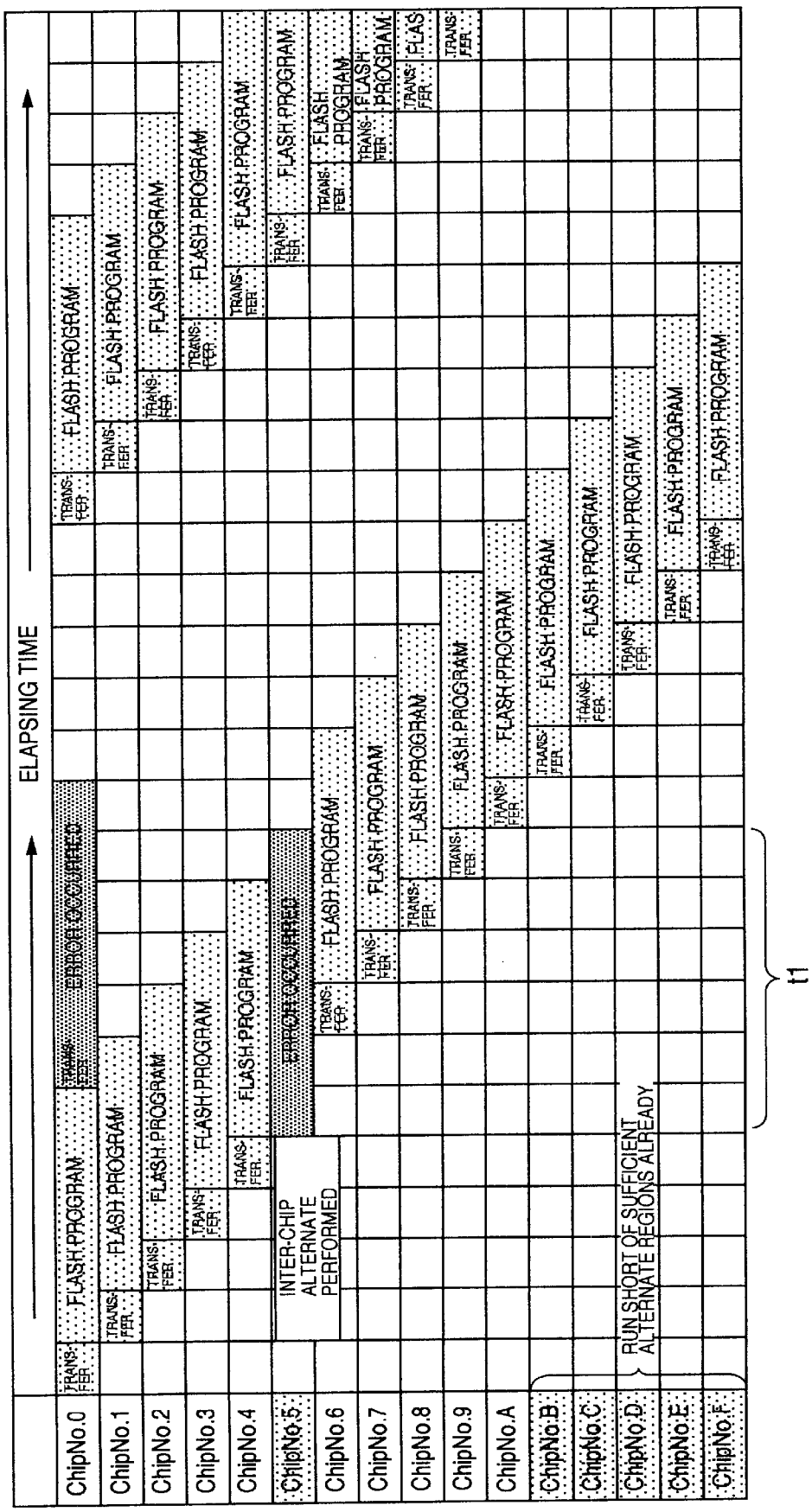
FIG. 17 is a timing chart for showing, as corresponding to a processing result by FIG. 10, a case where error occurrence was detected at an early stage after write-in operation start as a specific example of the alternate situation realized by the alternate control function when interleaved writing is supported.

FIG. 17 shows a alternate destination in a case where the flash memories of ChipNo. B through ChipNo. F specified as the candidate in FIG. 16 are in appropriate as the alternate destination, by specifying the flash memory of ChipNo. 0 after ending of inter-leaved writing. This corresponds to the processing results of FIG. 10.

Figure 18:
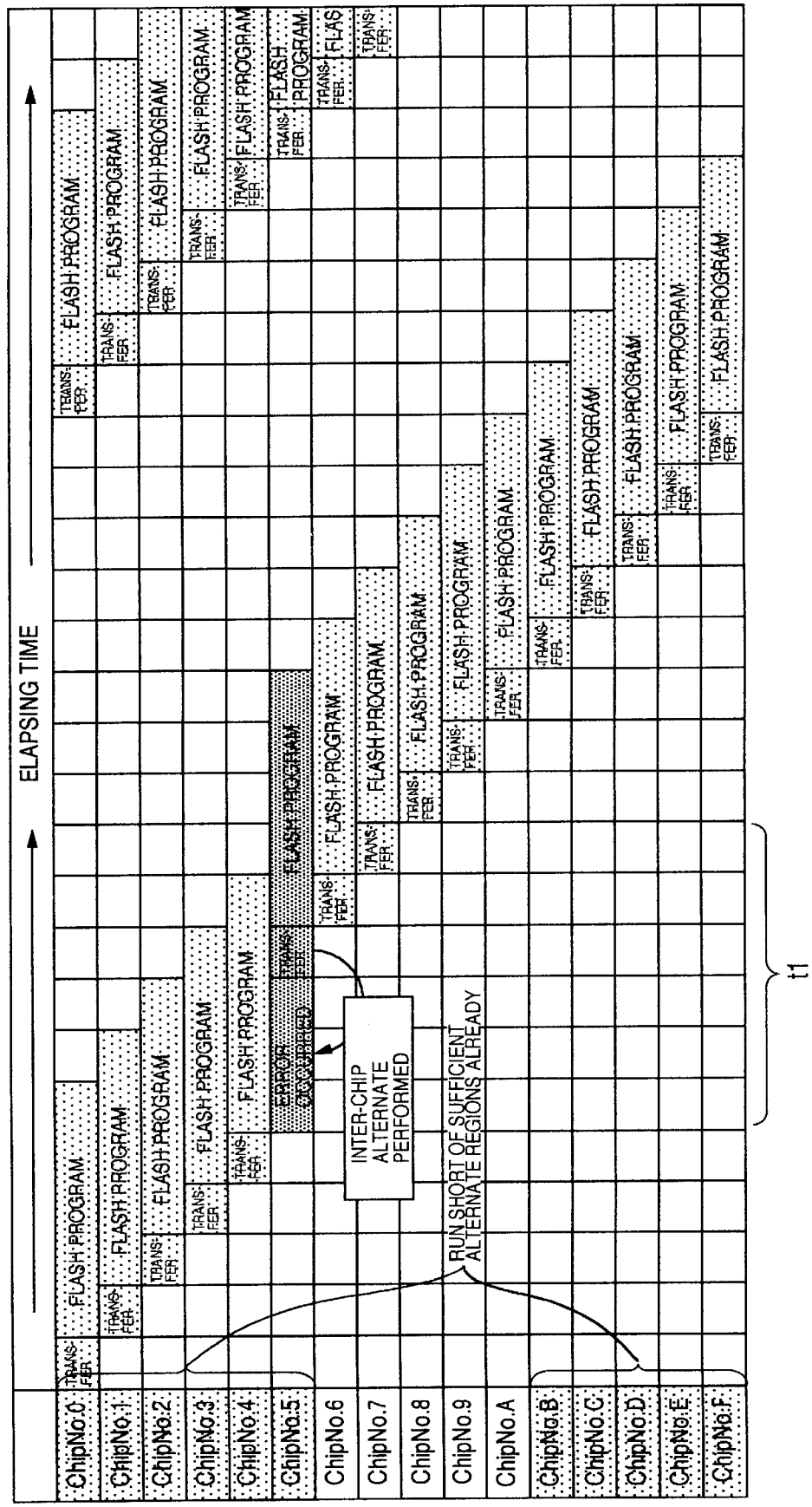
FIG. 18 is a timing chart for showing, as corresponding to a processing result by FIG. 11, a case where error occurrence was detected at an early stage after write-in operation start as a specific example of the alternate situation realized by the alternate control function when interleaved writing is supported.

In FIG. 18, the flash memory of ChipNo. 5 at which an error occurred is made subject to alternate in a case where none of the flash memories of, of course, ChipNo. 0 through ChipNo. 4 can be replaced in FIG. 17. This corresponds to the processing results of FIG. 11.

Figure 19:
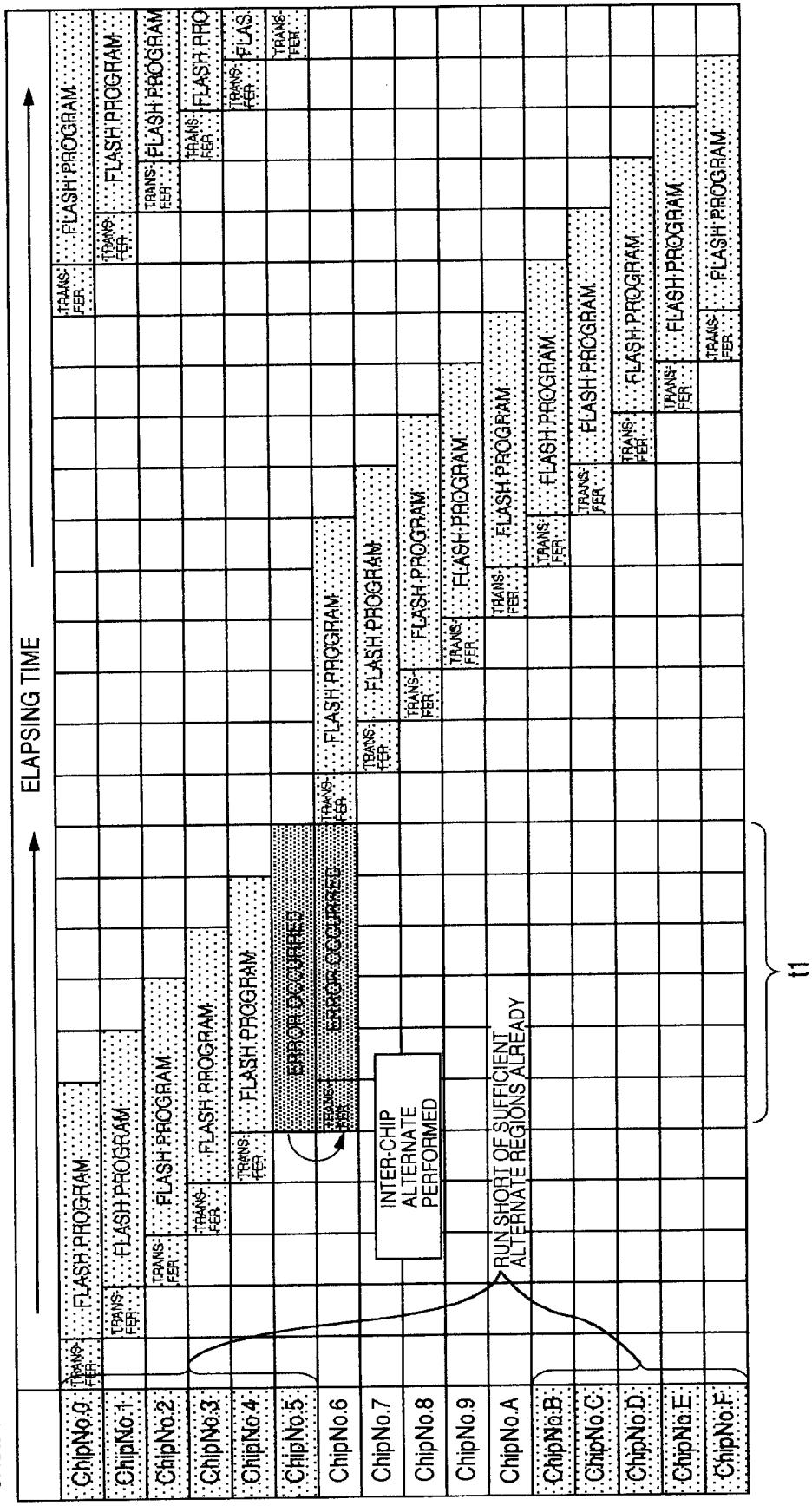
FIG. 19 is a timing chart for showing, as corresponding to a processing result by FIG. 12, a case where error occurrence was detected at an early stage after write-in operation start as a specific example of the alternate situation realized by the alternate control function when interleaved writing is supported.

In FIG. 19, the previous interleaving-subject flash memory ChipNo. 6 is made subject to alternate in a case where the flash memory ChipNo. 5 at which an error occurred in FIG. 18 cannot be replaced either. This operation interferes with interleaving operations. This corresponds to the processing results of FIG. 12.

Figure 20:
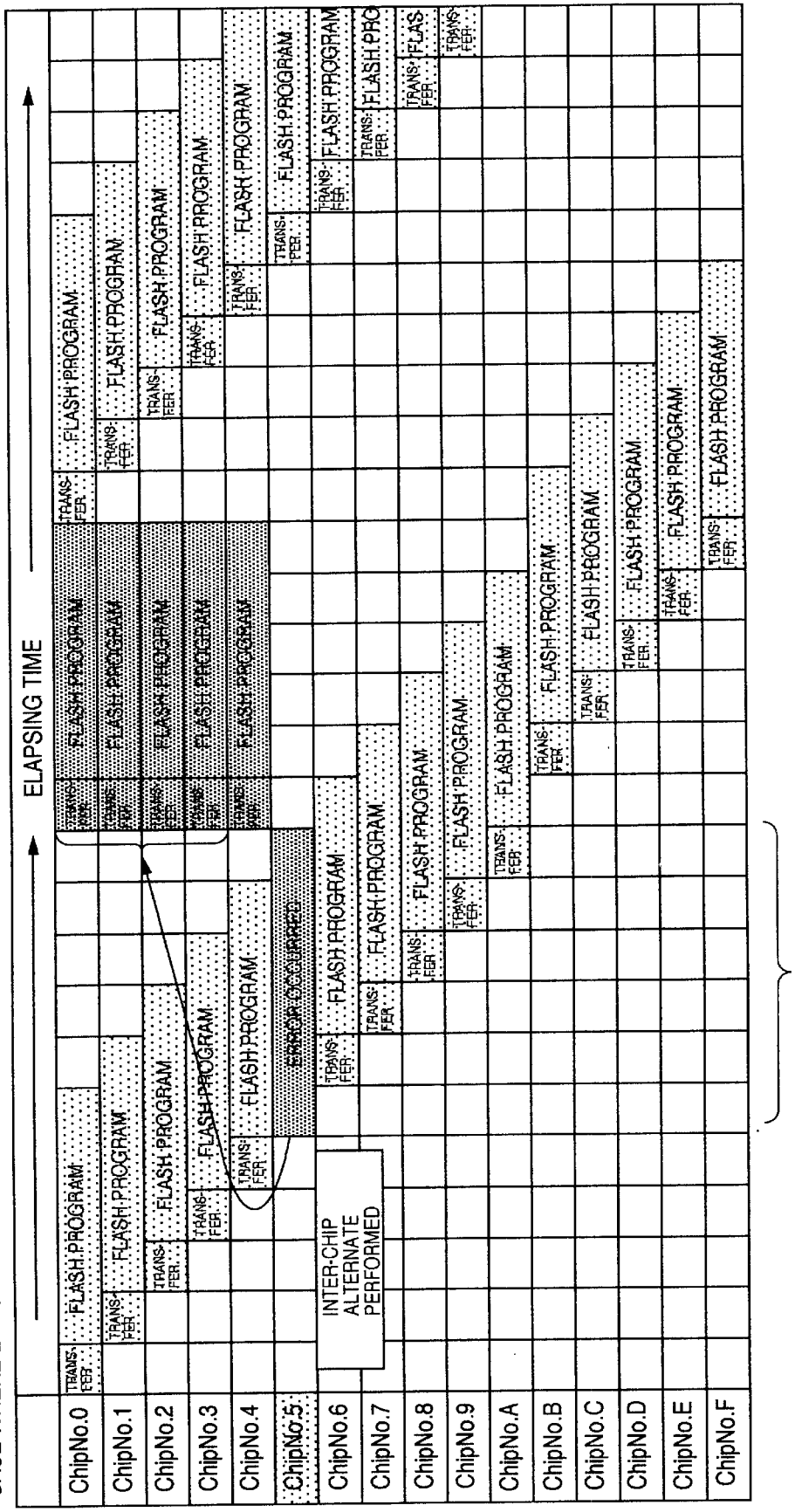
FIG. 20 is a timing chart for showing a case where error occurrence was detected at write-in operation termination as a specific example of the alternate situation realized by the alternate control function when interleaved writing is supported.

FIGS. 20–22 are based on a premise that error occurrence was detected upon termination of a write-in operation.

In FIG. 20, an error occurred at the g flash memory of ChipNo. 5. In this case, alternate processing may be performed using any one of, for example, the flash memories of ChipNo. 0 through ChipNo. 4 except those involved in interleaving currently and those made subject to the next interleaving operation.

FIG. 21 shows a alternate destination in a case where the flash memories of ChipNo. 0 through ChipNo. 4 selected as the candidate are appropriate as the alternate destination, in which any one, for example, flash memory ChipNo. 6, of the chips being interleaved currently is selected after it is finished with this interleaving operation and made subject to inter-chip alternate.

FIG. 22 shows a case where the flash memory ChipNo. 5 at which an error occurred is made subject to alternate in a case where none of the flash memories finished with the operation in FIG. 21 can be replaced. If this flash memory of ChipNo. 5 is also exhausted of all the alternate regions, the process searches for a new inter-chip alternate destination from among all of the chips mounted.

FIG. 23 shows a case where a small number of chips are mounted. In such a case, it is difficult to perform inter-chip alternate without interfering with the interleaving operation. (Alternate Control Function in the Case Where Interleaved Writing is Supported)

Figure 24:
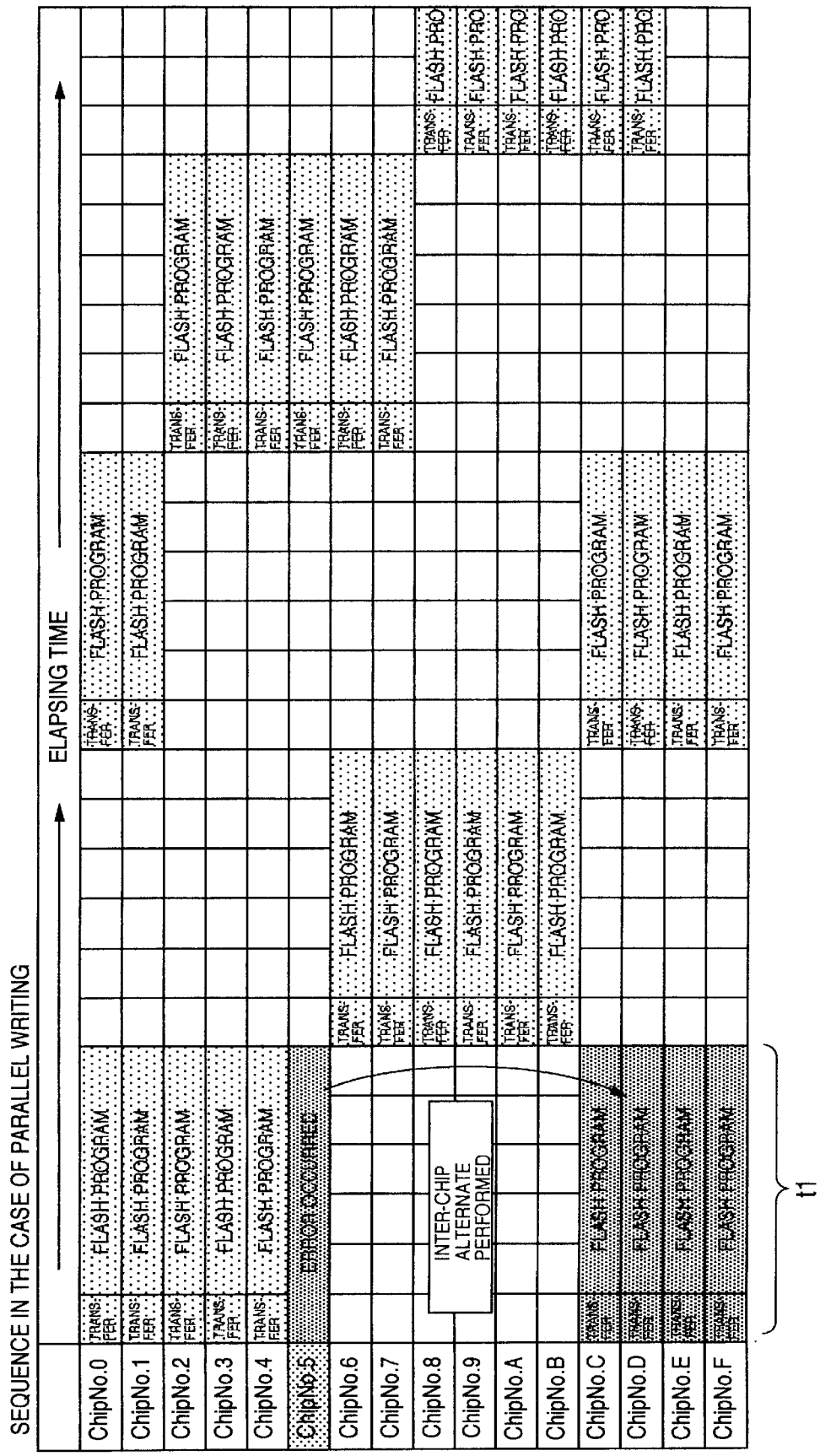
FIG. 24 is a timing chart for exemplifying a situation of inter-chip alternate when parallel writing is employed.

FIG. 24 exemplifies a situation of inter-chip alternate when parallel writing is employed.

When parallel writing is employed in place of the interleaved writing, the card controller CTR can control parallel writing by which it responds to a data write-in request sent from an external device, to write in write-in data in units of a predetermined data quantity to a plurality of flash memories concurrently. In the case of FIG. 24, the card controller writes in data to six flash memories concurrently. If it detected a write-in error during parallel writing, preferably the card controller selects the first candidate for another flash memory that substitutes for a storage region related to the write-in error from a range excluding those flash memories supposedly made subject to parallel writing including the flash memory at which said write-in error occurred. In the case of FIG. 24, upon error occurrence at the flash memory of ChipNo. 5, one of those of ChipNo. C through ChipNo. F is selected as the candidate for inter-chip alternate.

Although there have been hereinabove described specific embodiments in accordance with the present invention, the present invention is not limited thereto and, of course, may be modified in a variety of manners without departing from the gist thereof.

For example, the procedure for selecting the candidate for inter-chip alternate is not limited to the above-mentioned specific embodiments; in fact, such a modified procedure may be employed that selects the candidate so as not to interfere as much as possible with a write-in operation which is already started or expected to be started.

Furthermore, redundant redress may serves also to rescue the bit line side. The present invention is not limited in application to an Advanced Technology Attachment ATA memory card but may be applied widely to the other storage types of nonvolatile memories and the memory cards in accordance with the other standards. The number of the flash memories that are mounted is not limited to the above.

The typical effects of the present invention disclosed in the present application are briefed as follows.

That is, it is possible to provide a nonvolatile storage system that can improve redressing efficiency for a write-in error occurring as time passes by without replacing a faulty one of nonvolatile memories or using a preliminary nonvolatile memory in the system.

It is also possible to provide a nonvolatile storage system that can avoid an overall failure thereof without replacing a faulty one of nonvolatile memories or using a preliminary nonvolatile memory in replaced within any one of these memories.

In the nonvolatile storage systems, the storage region of each of the nonvolatile memories can be utilized fully to replace a faulty data block.

What is claimed is:

1. A nonvolatile storage system comprising a plurality of nonvolatile memories capable of read-out, erasure, and write-in operations and a control unit for controlling the operations of said nonvolatile memories in response to an external request, wherein when having detected a write-in error at any operation-subject one of said plurality of memories, said control unit can set to the nonvolatile memory having a storage region related to said write-in error such inter-chip alternate information indicating that said storage region related to said write-in error has been replaced with a storage region of any other nonvolatile memory of said plurality of memories and also, when having received the inter-chip alternate information from the operation-subject nonvolatile memory, can change the operation subject from the current operation-subject nonvolatile memory to said any other nonvolatile memory indicated by said inter-chip alternate information.

2. The nonvolatile storage system according to claim 1, wherein inter-chip alternate is enabled for a write-in error which occurred at such a nonvolatile memory that has a predetermined number or less of storage regions that can be adopted as a alternate destination.

3. The nonvolatile storage system according to claim 2, wherein when having detected a write-in error at the nonvolatile memory that still has more than the predetermined number of storage regions that can be adopted as the alternate destination, said control unit can set to the nonvolatile memory having the storage region related to said write-in error such intra-chip alternate information that indicates that said storage region related to said write-in error has been replaced with any other storage region of the same nonvolatile memory and also, when having received the intra-chip alternate information from the operation-subject nonvolatile memory, can change the operation subject from the current operation-subject nonvolatile memory to the storage region indicated by said intra-chip alternate information.

4. The nonvolatile storage system according to claim 3, wherein said control unit can adopt as the candidate for the inter-chip alternate destination nonvolatile memory such a nonvolatile memory that still has more than the predetermined number of storage regions that can be adopted as the alternate destination.

5. The nonvolatile storage system according to claim 4, wherein if there is not said candidate that can be adopted, said control unit can adopt as another candidate for the alternate destination such a nonvolatile memory that has the predetermined number or less of storage regions that can be adopted as the alternate destination.

6. The nonvolatile storage system according to claim 1, wherein said control unit can respond to the external data write-in request to thereby control interleaved writing of sequentially writing the write-in data in units of the predetermined data quantity to the plurality of nonvolatile memories as shifting write-in timings, so that when having detected the write-in error during the interleaved writing operation, said control unit excludes as any other nonvolatile memory that substitutes for the storage region related to said write-in error a series of the nonvolatile memories supposedly involved in the interleaved writing operation including the nonvolatile memory where said write-in error occurred.

7. The nonvolatile storage system according to claim 4, wherein said control unit can respond to the external data write-in request to thereby control interleaved writing of sequentially writing the write-in data in units of the predetermined data quantity to the plurality of nonvolatile memories as shifting the write-in timings, so that when having detected the write-in error during the interleaved writing operation, said control unit selects a first candidate for any other nonvolatile memory that substitutes for the storage region related to said write-in error from among the nonvolatile memories that are distant from the preceding and following nonvolatile memories by a predetermined number of the nonvolatile memories.

8. The nonvolatile storage system according to claim 7, wherein if said first candidate cannot be selected, said control unit selects a second candidate for the alternate destination that can be adopted from among the nonvolatile memories that follow said first candidate in interleaving order outside the range in which said first candidate can be selected.

9. The nonvolatile storage system according to claim 8, wherein if said second candidate cannot be selected, said control unit replaces the storage regions with each other using the nonvolatile memory where the write-in error occurred as a third candidate for the alternate destination.

10. The nonvolatile storage system according to claim 9, wherein if said third candidate cannot be selected, said control unit selects a fourth candidate for the alternate destination that can be adopted from among the nonvolatile memories that precede said first candidate in interleaving order outside the range in which said first candidate can be selected.

11. The nonvolatile storage system according to any one of claim 1, wherein said control unit can respond to the external data write-in request to there-by control parallel writing of concurrently writing the write-in data in units of the predetermined data quantity to a plurality of different nonvolatile memories, so that when having detected the write-in error during the parallel writing operation, said control unit selects the first candidate for any other nonvolatile memory that substitutes for the storage region related to said write-in error from the range excluding the nonvolatile memories supposed to be subject to the parallel writing including the nonvolatile memory where said write-in error occurred.

12. Nonvolatile storage system comprising a control unit and a plurality of nonvolatile memories, wherein:

said control unit receives external data and address information to thereby control storage of said received external data to said plurality of nonvolatile memories, read-out of said external data from said nonvolatile memories, and erasure of said data stored in said nonvolatile memories;

each of said nonvolatile memories responds to an operation instruction sent from said control unit to thereby perform a write-in operation of storing data supplied from said control unit, a read-out operation of reading out the stored data and then supplying said data to said controller, and an erasure operation of erasing the stored data;

said control unit sub-divide said received external data into data portions of a predetermined size to then perform an interleaving operation of supplying a first data portion of the sub-divided data portions to the first nonvolatile memory together with a write-in operation instruction and then supplying a second data portion to the second nonvolatile memory together with the write-in operation instruction while writing the data to said first nonvolatile memory, thus sequentially supplying all of said sub-divided data portions to said plurality of nonvolatile memories respectively; and when having detected a write-in error which occurred during writing of predetermined data to any one of said plurality of nonvolatile memories, said control unit controls data storage of supplying said predetermined data together with the write-in operation instruction to each of the nonvolatile memories other than the nonvolatile memory currently involved in the write-in operation and the nonvolatile memories that are made subject to writing of the sub-divided data portion after the occurrence of said write-in error.

13. The nonvolatile storage system according to claim 12, wherein:

said nonvolatile memories each have a plurality of memory cells, a plurality of word lines, and a plurality of bit lines;

said plurality of memory cells are disposed at intersections of said word lines and said bit lines that correspond thereto;

the memory cells connected to each of said word lines are classified into a first group and a second group, so that the memory cells belonging to said first group are used to store data supplied from said control unit and the memory cells belonging to said second group are used to store predetermined information; and said predetermined information contains information that indicates whether the write-in error occurred when said predetermined data was being stored to the memory cell connected to the corresponding word line during said write-in operation and information that indicates the nonvolatile memory that stored said predetermined data when said write-in error occurred.

14. The nonvolatile storage system according to claim 13, wherein said predetermined size of said sub-divided data portions is such that can be stored in the memory cell belonging to said first group.

15. The nonvolatile storage system according to claim 13, wherein said write-in, read-out, and erasure operations are all performed for each of said word lines.

16. The nonvolatile storage system according to claim 15, wherein:

said memory cells each store data based on a threshold voltage of said data to be stored;

said write-in operation is comprised of a first operation of changing the threshold voltage of each of the memory cells to the threshold voltage of the data to be stored and a second operation of confirming whether said threshold voltage of each of said memory cells has been changed to the corresponding threshold voltage, said first and second operations being repeated a predetermined number of times; and said write-in error is recognized when, after said first and second operations were repeated the predetermined number of times, the threshold voltage of at least one of the memory cells was found not to have been changed to the corresponding threshold voltage.

17. The nonvolatile storage system according to claim 16, wherein:

when having detected said write-in error during said write-in operation, said nonvolatile memories notify said control unit of the occurrence of said write-in error; and when thus notified of the occurrence of said write-in error, said control unit, before giving the write-in operation instruction to said other nonvolatile memories, performs the write-in operation to the nonvolatile memory where said write-in error occurred by specifying the word line different from the word line involved in the write-in operation when said write-in error occurred.

18. The nonvolatile storage system according to claim 17, wherein said nonvolatile memories, before notifying said control unit of the occurrence of the write-in error, can perform the write-in operation via redundant means by specifying the word line different from the word line involved in the write-in operation when said write-in error occurred.

* * * * *